US012575321B2

(12) United States Patent
Hua et al.

(10) Patent No.: US 12,575,321 B2
(45) Date of Patent: Mar. 10, 2026

(54) LIGHT-EMITTING LAYER, LIGHT-EMITTING DEVICE AND LIGHT-EMITTING APPARATUS

(71) Applicant: Hubei Yangtze Industrial Innovation Center of Advanced Display Co., LTD., Wuhan (CN)

(72) Inventors: Wanming Hua, Shanghai (CN); Jinghua Niu, Shanghai (CN); Yafei Lin, Shanghai (CN); Jianyun Wang, Shanghai (CN); Shaoli Zhang, Shanghai (CN)

(73) Assignee: Hubei Yangtze Industrial Innovation Center Of Advanced Display Co., LTD., Wuhan (CN)

( * ) Notice: Subject to any disclaimer, the term of this patent is extended or adjusted under 35 U.S.C. 154(b) by 806 days.

(21) Appl. No.: 17/898,127

(22) Filed: Aug. 29, 2022

(65) Prior Publication Data

US 2024/0008362 A1 Jan. 4, 2024

(30) Foreign Application Priority Data

Jun. 30, 2022 (CN) ......................... 202210758513.3

(51) Int. Cl.

| | |
|---|---|
| ***H10K 85/60*** | (2023.01) |
| ***C09K 11/06*** | (2006.01) |
| ***H10K 50/11*** | (2023.01) |
| ***H10K 85/30*** | (2023.01) |
| ***H10K 101/10*** | (2023.01) |
| ***H10K 101/30*** | (2023.01) |

(52) U.S. Cl.

CPC .......... *H10K 85/6572* (2023.02); *C09K 11/06* (2013.01); *H10K 85/322* (2023.02); *H10K 85/342* (2023.02); *H10K 85/615* (2023.02); *H10K 85/654* (2023.02); *C09K 2211/1018* (2013.01); *C09K 2211/1029* (2013.01); *C09K 2211/1033* (2013.01); *C09K 2211/185* (2013.01); *H10K 50/11* (2023.02); *H10K 2101/10* (2023.02); *H10K 2101/30* (2023.02)

(58) Field of Classification Search

CPC ............. H10K 85/6572; H10K 85/322; H10K 85/654; H10K 85/342; H10K 85/615; H10K 2101/10; H10K 2101/30; H10K 50/11; C09K 11/09; C09K 2211/1018; C09K 2211/1029; C09K 2211/1033; C09K 2211/185

USPC ..................................................... 252/301.16

See application file for complete search history.

(56) References Cited

U.S. PATENT DOCUMENTS

2020/0343469 A1* 10/2020 Ohsawa ................ H10K 50/16

FOREIGN PATENT DOCUMENTS

| | | |
|---|---|---|
| CN | 105810846 A | 7/2016 |
| CN | 111656549 A | 9/2020 |
| CN | 114171692 A | 3/2022 |
| CN | 114286851 A | 4/2022 |

* cited by examiner

*Primary Examiner* — Anita Nassiri-Motlagh
(74) *Attorney, Agent, or Firm* — Anova Law Group, PLLC

(57) ABSTRACT

A light-emitting layer, a light-emitting device and a light-emitting apparatus are provided. The light-emitting layer includes a thermally activated delayed fluorescence (TADF) material, a phosphorescent material, a multiple resonance fluorescent material and a host material.

19 Claims, 2 Drawing Sheets

LIGHT-EMITTING LAYER, LIGHT-EMITTING DEVICE AND LIGHT-EMITTING APPARATUS

CROSS-REFERENCE TO RELATED APPLICATION

This application claims the priority of Chinese patent application No. 202210758513.3, filed on Jun. 30, 2022, the entirety of which is incorporated herein by reference.

FIELD

The present disclosure generally relates to the field of light-emitting technology and, more particularly, relates to a light-emitting layer, a light-emitting device and a light-emitting apparatus.

BACKGROUND

Multiple resonance fluorescent materials are high-efficiency and narrow-spectrum light-emitting materials that have emerged in recent years. Due to the opposite vibration directions of B and N, the highest-occupied molecular orbital (HOMO) and lowest-unoccupied molecular orbital (LUMO) of the material are separated on the molecular skeleton, thereby obtaining narrow-spectrum fluorescence emission while forming a substantially small single-triplet energy level difference. The organic light-emitting diode (OLED) device having a light-emitting layer doped with narrow-spectrum fluorescent material and thermally activated delayed fluorescence (TADF) material may achieve high-efficient light emission and pure light color, such technology refers to super-fluorescence technology.

Triplet excitons in the OLED account for the majority, and the TADF material may be used to convert triplet excitons into light. The TADF-sensitized fluorescence has substantially high color purity, but the TADF material has a substantially wide spectrum and is not an ideal light-emitting material. Although multiple resonance fluorescent material (fluorescent material with narrow spectrum) is added, the high-energy triplet excitons on the TADF cannot be converted into singlet excitons in time, such that the OLED device is in a high-energy state for a long time and has a problem of substantially low device life. At the same time, because the triplet excitons are transferred to the fluorescent material through the Dexter energy, and the TADF material transfers the energy to the fluorescent material through the Foster mechanism, there may be two emission mechanisms of TADF and fluorescence, resulting in unstable emission spectrum.

SUMMARY

One aspect of the present disclosure provides a light-emitting layer. The light-emitting layer includes a thermally activated delayed fluorescence (TADF) material, a phosphorescent material, a multiple resonance fluorescent material and a host material.

Another aspect of the present disclosure provides a light-emitting device. The light-emitting device includes a light-emitting layer. The light-emitting layer includes a thermally activated delayed fluorescence (TADF) material, a phosphorescent material, a multiple resonance fluorescent material and a host material.

Another aspect of the present disclosure provides a light-emitting apparatus. The light-emitting apparatus includes a light-emitting device, and the light-emitting device includes a light-emitting layer. The light-emitting layer includes a thermally activated delayed fluorescence (TADF) material, a phosphorescent material, a multiple resonance fluorescent material and a host material.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
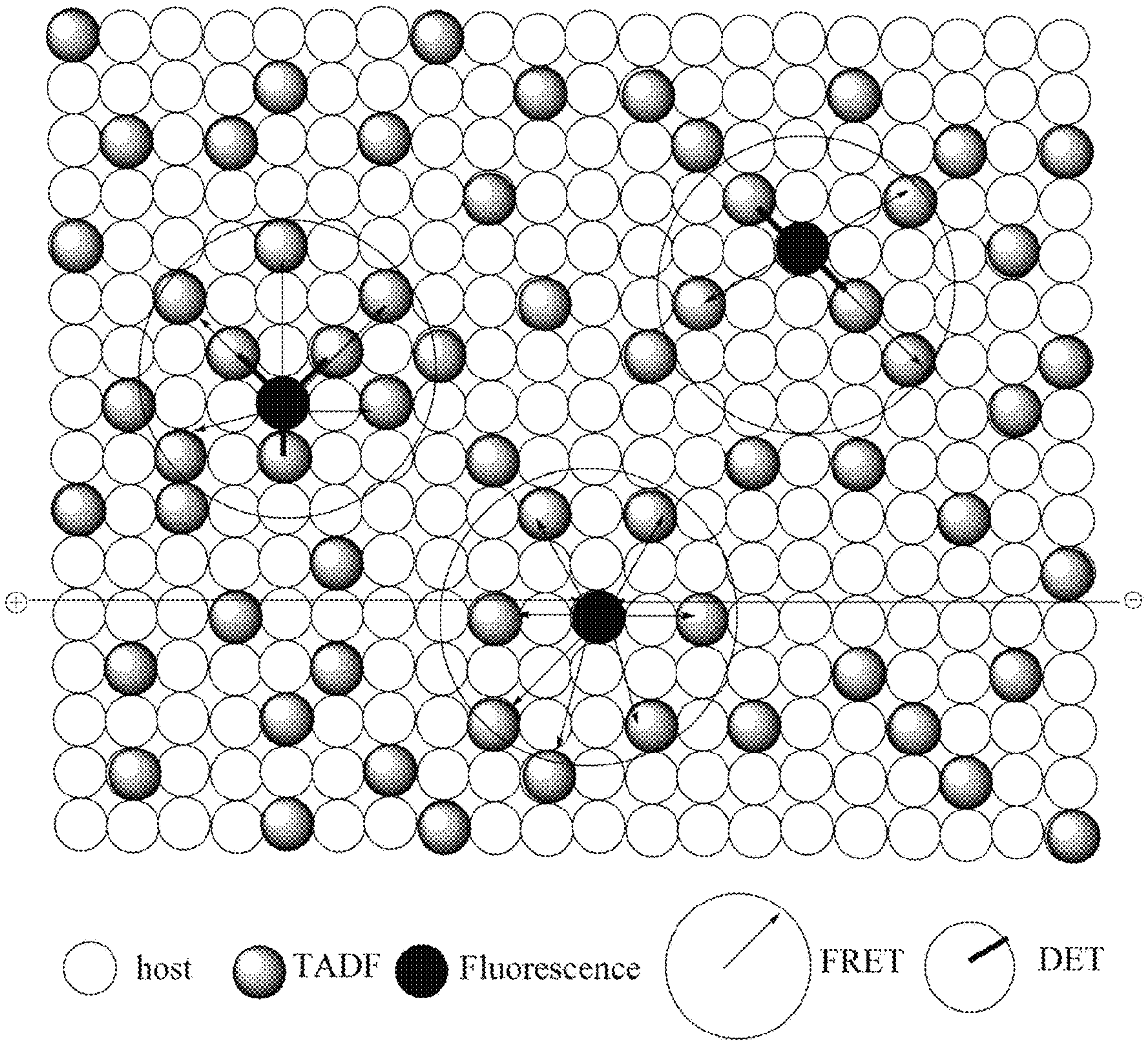
FIG. 1 illustrates a schematic diagram of a light-emitting layer.

FIG. 1 illustrates a light-emitting layer, which is made of a TADF-sensitized multiple resonance fluorescent material. Although the TADF-sensitized fluorescence has high color purity, the high-energy triplet excitons on the TADF (i.e., thermally activated delayed fluorescence (TADF)) cannot be converted into singlet excitons in time, such that the OLED device is in a high-energy state for a long time and has a problem of substantially low device life. At the same time, because the triplet excitons are transferred to the fluorescent material through the Dexter energy, the device performance will be degraded. The TADF in the device transfers the energy to the fluorescent material through the Foster mechanism, and the stability and efficiency of the transfer process determine whether the emission spectrum is stable, such that there may be two emission mechanisms of TADF and fluorescence. The instability or poor stability of the emission spectrum is extremely detrimental to product production.

The present disclosure provides a light-emitting layer. The light-emitting layer may include a TADF material, a phosphorescent material, a multiple resonance fluorescent material and a host material.

In the present disclosure, the phosphorescent material added in the light-emitting layer may receive triplet excitons, and the triplet excitons may be transferred to the singlet energy level of the multiple resonance fluorescent material, thereby reducing the triplet excitons inside the device and improving the device life. The multiple resonance fluorescent material may convert the triplet excitons into singlet excitons while receiving a small quantity of triplet excitons, thereby improving the device efficiency. Due to the double quenching effect of the phosphorescent material and the multiple resonance fluorescent material on the TADF material, the luminescence of the TADF material may be fully suppressed, which may improve the stability of the emission spectrum.

Figure 2:
FIG. 2 illustrates a schematic diagram of a light-emitting layer consistent with disclosed embodiments of the present disclosure.

Referring to FIG. 2, in the present disclosure, the triplet excitons may be converted into singlet excitons through the synergistic action of the TADF material, the phosphorescent material and the multiple resonance fluorescent material, which may reduce the quantity of triplet excitons and may improve the device life and efficiency. The TADF material may transfer a portion of the triplet excitons and singlet excitons to the phosphorescent material. Due to the heavy metal spin-orbit coupling effect, the singlet energy level and the triplet energy level of the phosphorescent material may overlap each other, and the phosphorescent material may transfer energy in the form of singlet state to the multiple resonance fluorescent material. In addition, the TADF material may transfer a portion of the singlet excitons and a small quantity of triplet excitons to the multiple resonance fluorescent material. Because the multiple resonance fluorescent material has weak TADF characteristics, the received small quantity of triplet excitons may be converted into singlet excitons. The energy in the phosphorescent material and TADF material may be transferred to the multiple resonance fluorescent material without loss in theory, and the multiple resonance fluorescent material, as a high-efficiency light-emitting material, may fully convert the energy into light in time, such that the device may have highest efficiency. In the present disclosure, the triplet excitons may be converted into singlet excitons that are capable of emitting light rapidly through the synergistic action of the TADF material and the phosphorescent material, the quantity of excitons in the device may be reduced, and the device life may increase.

In the present disclosure, the TADF material may be a material with thermally activated delayed fluorescence effect. In the present disclosure, in one embodiment, the energy level difference between the singlet state and the triplet state of the TADF material may be less than 0.3 eV, such as 0.1 eV, 0.2 eV.

In the present disclosure, the phosphorescent material may be a material with a phosphorescence effect and containing heavy metal elements. The phosphorescent material may serve as an energy transfer medium, and at the same time, may mix the triplet excitons and the singlet excitons to improve exciton utilization.

In the present disclosure, the multiple resonance fluorescent material may serve as the light-emitting material. The multiple resonance fluorescent material may be the multiple resonance material and may convert a portion of the triplet excitons into singlet excitons. It may be difficult to convert all triplet excitons into singlet excitons due to insufficient crossover rate between inverse systems, such that the addition quantity of the multiple resonance fluorescent material may need to be reduced.

In the present disclosure, the host material may include one or more materials with hole transport and/or electron transport functions.

In the present disclosure, in one embodiment, the singlet energy level of the host material may be greater than the singlet energy level of the TADF material, and the triplet energy level of the host material may be greater than the triplet energy level of the TADF material. The singlet energy level of the TADF material may be greater than the singlet energy level of the phosphorescent material, and the triplet energy level of the TADF material may be greater than the triplet energy level of the phosphorescent material. The singlet energy level of the phosphorescent material may be greater than the singlet energy level of the multiple resonance fluorescent material, and the triplet energy level of the phosphorescent material may be greater than the triplet energy level of the multiple resonance fluorescent material.

In the present disclosure, through configuring the setting of singlet and triplet energy levels of the host material, the TADF material, the phosphorescent material, and the multiple resonance fluorescent material, high-efficient light emission may be achieved.

In the present disclosure, in one embodiment, the HOMO energy levels of the host material, the TADF material, the phosphorescent material and the multiple resonance fluorescent material may gradually increase, and the LUMO energy levels of the host material, the TADF material, the phosphorescent material and the multiple resonance fluorescent material may gradually decrease.

In the present disclosure, in one embodiment, the HOMO energy level difference between the host material and the TADF material may be less than 0.1 eV, such as 0.02 eV, 0.04 eV, 0.06 eV, and 0.08 eV, and the LUMO energy level difference between the host material and the TADF material may be less than 0.1 eV, such as 0.02 eV, 0.04 eV, 0.06 eV, and 0.08 eV. The HOMO energy level difference between the TADF material and the phosphorescent material may be less than 0.1 eV, such as 0.02 eV, 0.04 eV, 0.06 eV, and 0.08 eV, and the LUMO energy level difference between the TADF material and the phosphorescent material may be less than 0.1 eV, such as 0.02 eV, 0.04 eV, 0.06 eV, and 0.08 eV. The HOMO energy level difference between the phosphorescent material and the multiple resonance fluorescent material may be less than 0.1 eV, such as 0.02 eV, 0.04 eV, 0.06 eV, and 0.08 eV, and the LUMO energy level difference between the phosphorescent material and the multiple resonance fluorescent material may be less than 0.1 eV, such as 0.02 eV, 0.04 eV, 0.06 eV, and 0.08 eV.

In the present disclosure, in one embodiment, the difference between the HOMO energy level of the TADF material and the LUMO energy level of the phosphorescent material may be greater than the triplet energy level of the phosphorescent material by more than 0.2 eV, such as 0.3 eV, 0.4 eV, and 0.5 eV. The difference between the LUMO energy level of the TADF material and the HOMO energy level of the phosphorescent material may be greater than the triplet energy level of the phosphorescent material by more than 0.2 eV, such as 0.3 eV, 0.4 eV, and 0.5 eV.

In the present disclosure, in one embodiment, the difference between the HOMO energy level of the TADF material and the LUMO energy level of the multiple resonance fluorescent material may be greater than the singlet energy level of the multiple resonance fluorescent material by more than 0.2 eV, such as 0.3 eV, 0.4 eV, and 0.5 eV. The difference between the LUMO energy level of the TADF material and the HOMO energy level of the multiple resonance fluorescent material may be greater than the singlet energy level of the multiple resonance fluorescent material by more than 0.2 eV, such as 0.3 eV, 0.4 eV, and 0.5 eV.

In the present disclosure, through configuring the setting of the HOMO energy level, LUMO energy level and triplet energy level of the above-mentioned host material, TADF material, phosphorescent material, and multiple resonance fluorescent material, exciplexes may be prevented from being formed to avoid energy deactivation.

In the present disclosure, in one embodiment, the luminescence peak of the TADF material may be red-shifted by less than 0.3 eV with respect to the peak of a minimum absorption band of the phosphorescent material, such as 0.1 eV and 0.2 eV. The luminescence peak of the phosphorescent material may be red-shifted by less than 0.3 eV with respect to the absorption peak in visible light band of the multiple resonance fluorescent material, such as 0.1 eV and 0.2 eV. The luminescence peak of the TADF material may be red-shifted by less than 0.3 eV with respect to the absorption peak in visible light band of the multiple resonance fluorescent material, such as 0.1 eV and 0.2 eV.

In the present disclosure, through configuring the setting of the luminescence peaks of the above-mentioned TADF material, phosphorescent material, and multiple resonance fluorescent material, the energy difference between the luminescence peak of the energy donor and the absorption peak of the energy acceptor may be substantially small, such that the energy transfer inside the light-emitting layer may be substantially efficient.

In the present disclosure, in one embodiment, the TADF material may have the structure of Formula A:

Formula A

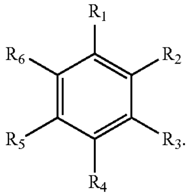

In Formula A, $R_1$-$R_6$ may be independently selected from hydrogen, deuterium, halogen, cyano, alkyl, substituted or unsubstituted aryl, and substituted or unsubstituted heteroaryl. In the present disclosure, the halogen in the Formula A may be selected from F, the alkyl may be selected from methyl and $CD_3$, the aryl may be selected from phenyl, and the heteroaryl may be selected from the following formulas:

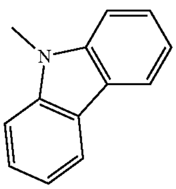

,

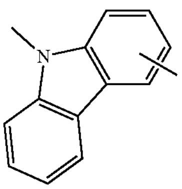

.

In the present disclosure, the TADF material may be selected from one or more of structures of Formulas A-1 to A-20:

Formula A-1

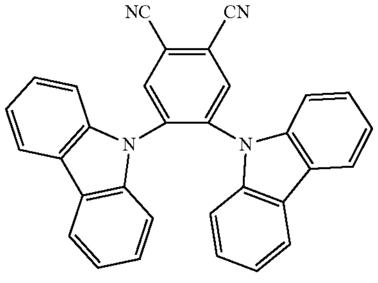

Formula A-2

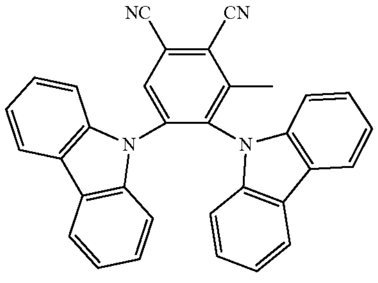

Formula A-3

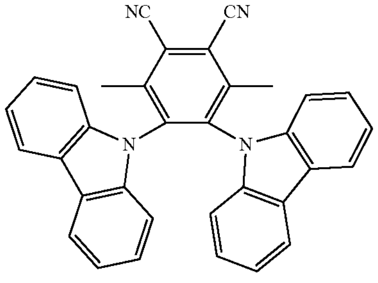

Formula A-4

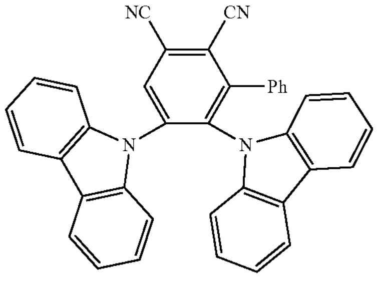

Formula A-5

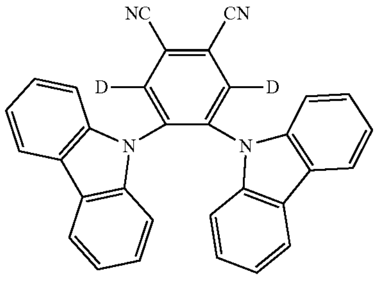

-continued
Formula A-6
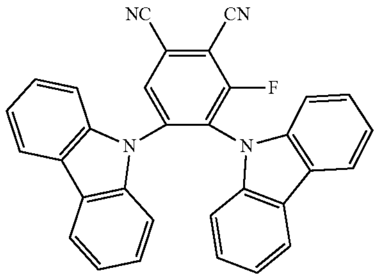
Formula A-7
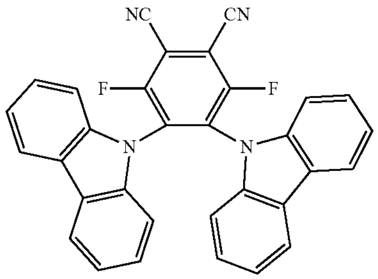
Formula A-8
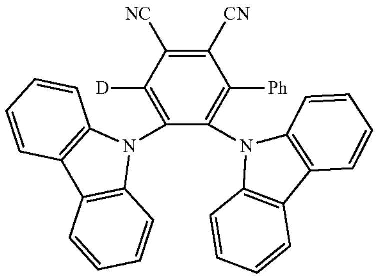
Formula A-9
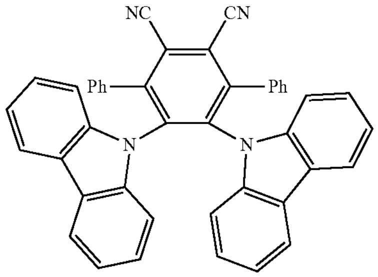
Formula A-10
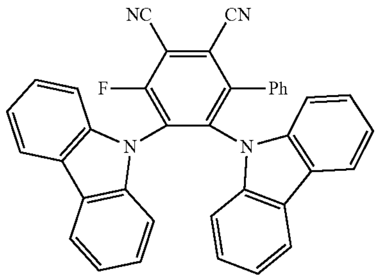
-continued
Formula A-11
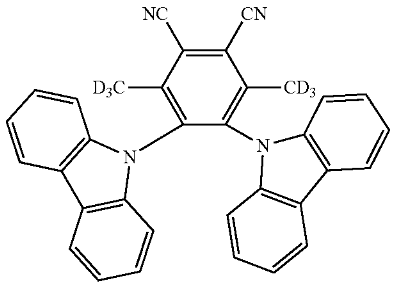
Formula A-12
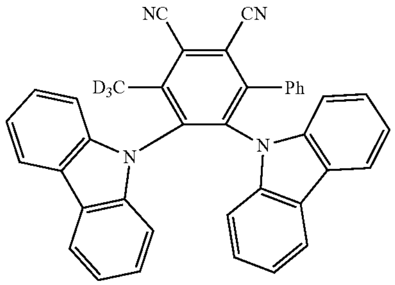
Formula A-13
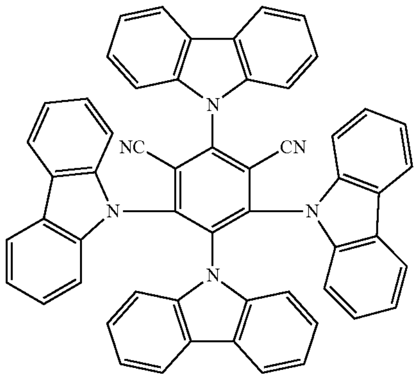
Formula A-14
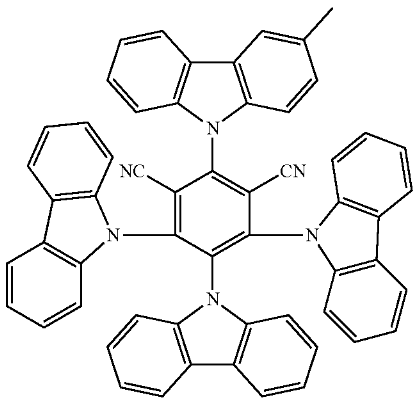

-continued

Formula A-15

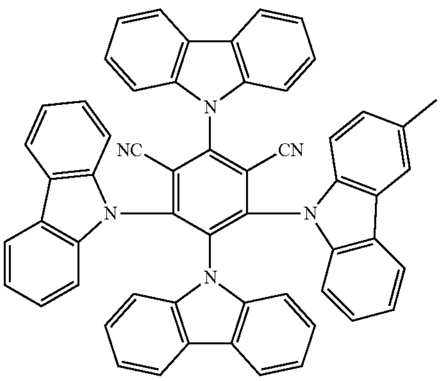

Formula A-16

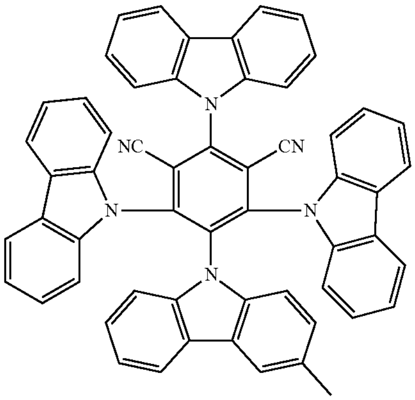

Formula A-17

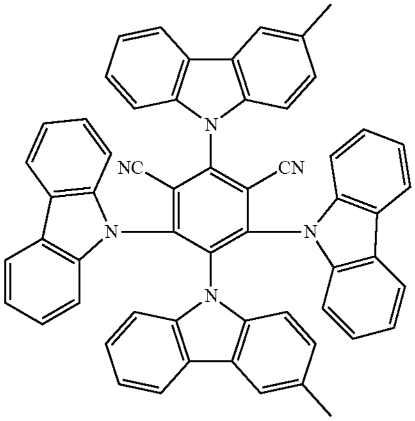

Formula A-18

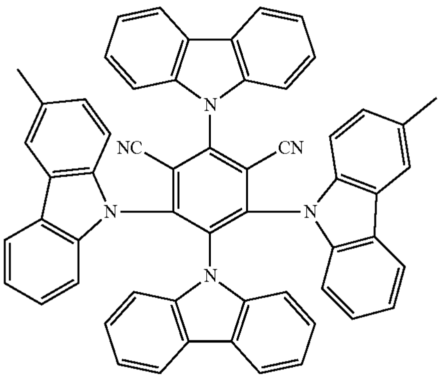

-continued

Formula A-19

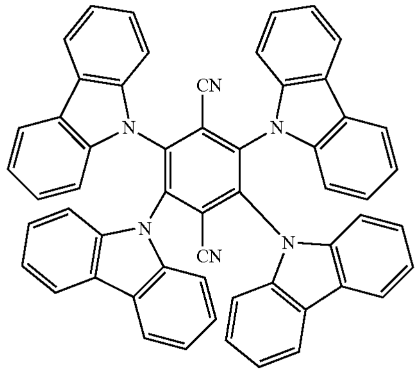

Formula A-20

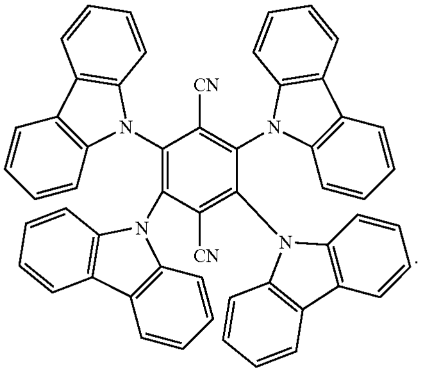

In the present disclosure, in one embodiment, the phosphorescent material may have the structure of Formula B:

Formula B

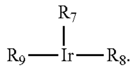

In the Formula B, $R_7$-$R_9$ may be independently selected from substituted or unsubstituted aryl, and substituted or unsubstituted heteroaryl.

In the present disclosure, the $R_7$-$R_9$ may be independently selected from following groups:

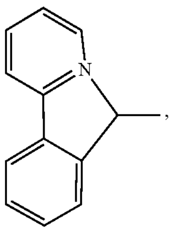

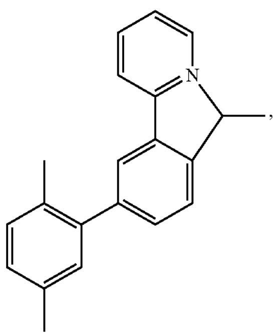

-continued
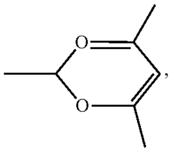
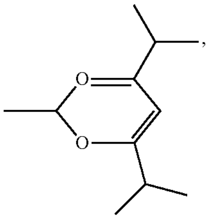
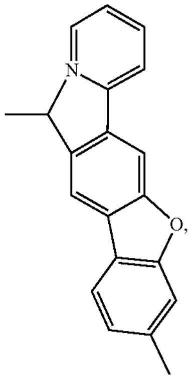
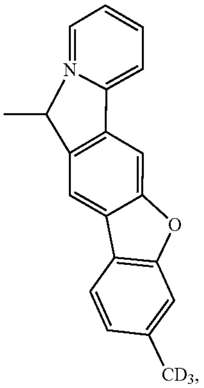
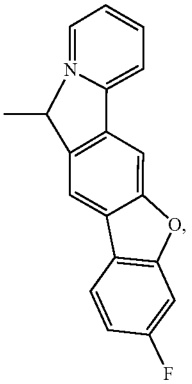
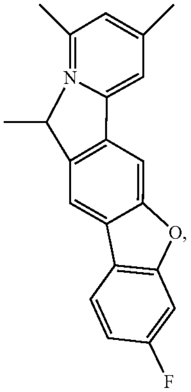
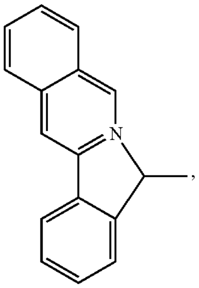
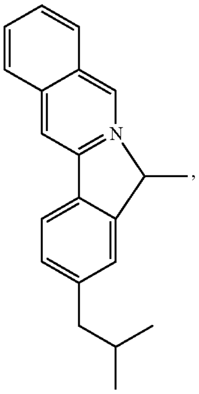
-continued
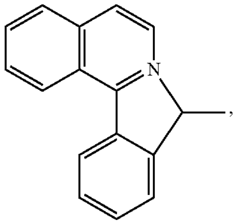
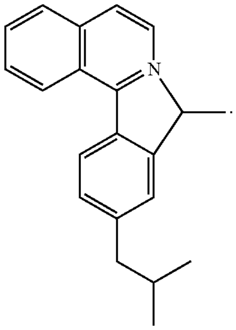
In the present disclosure, the phosphorescent material may be selected from one or more of structures of Formulas B-1 to B-14:
Formula B-1
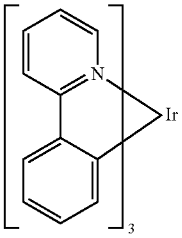
Formula B-2
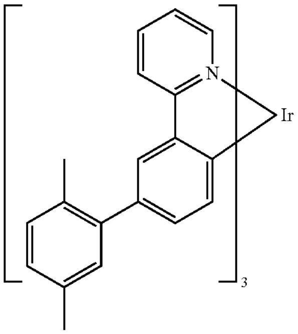
Formula B-3
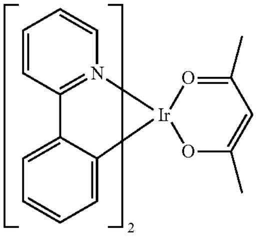
Formula B-4
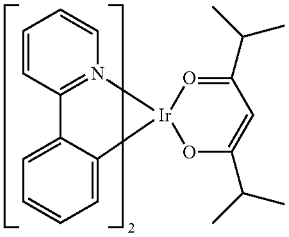

-continued
Formula B-5
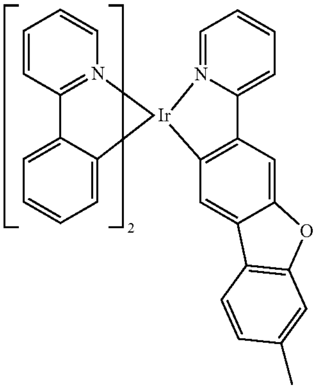
Formula B-6
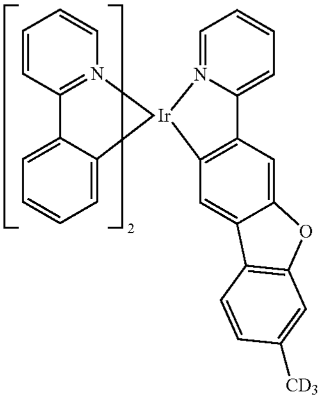
Formula B-7
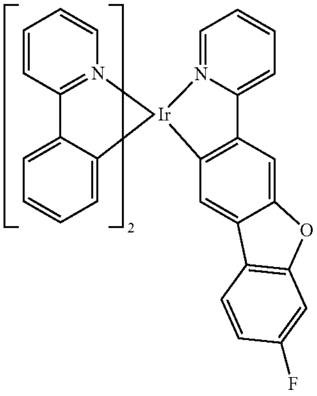
Formula B-8
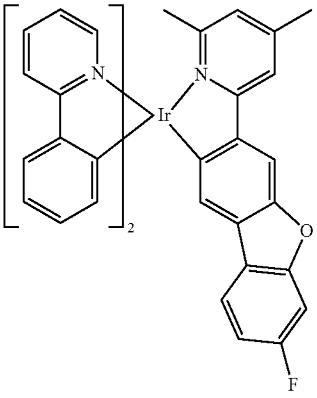
-continued
Formula B-9
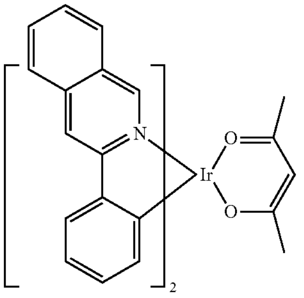
Formula B-10
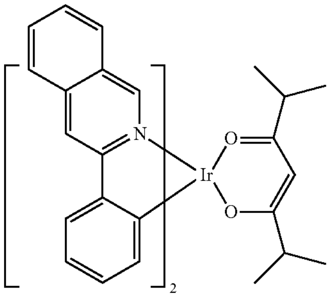
Formula B-11
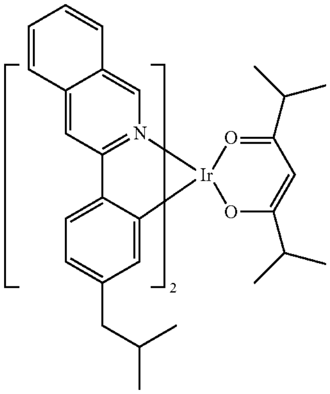
Formula B-12
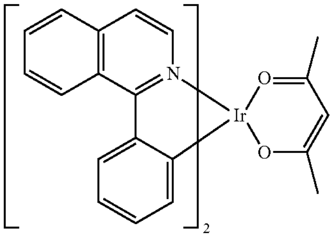
Formula B-13
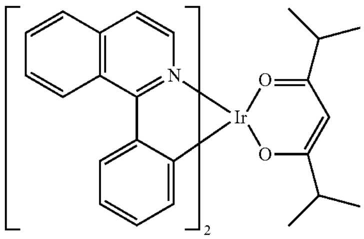

-continued

Formula B-14

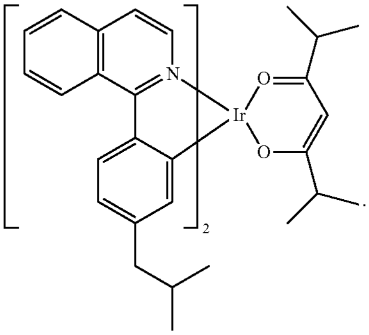

In the present disclosure, in one embodiment, the multiple resonance fluorescent material may have the structure of Formula C:

Formula C

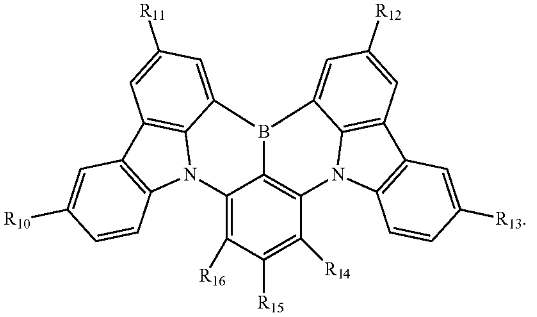

In the Formula C, $R_{10}$-$R_{16}$ may be independently selected from hydrogen, deuterium, halogen, —B=, substituted or unsubstituted alkyl, substituted or unsubstituted aryl, and substituted or unsubstituted heteroaryl.

In the present disclosure, unsubstituted alkyl group in the Formula C may be selected from methyl and butyl, substituted alkyl group may be selected from —$Si(CH_3)_3$, aryl group may be selected from phenyl, and heteroaryl may be selected from following structures:

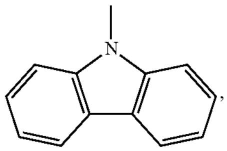
,
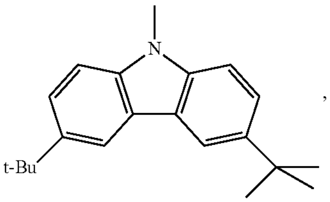
,
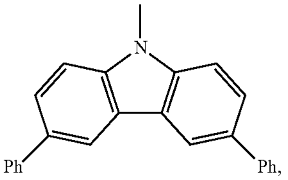

-continued

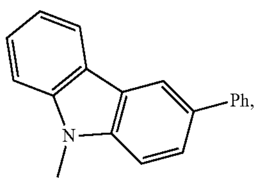

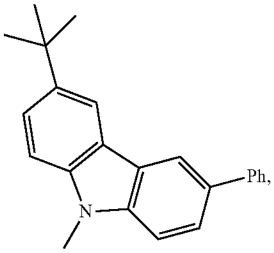

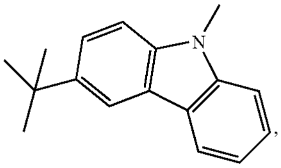
,
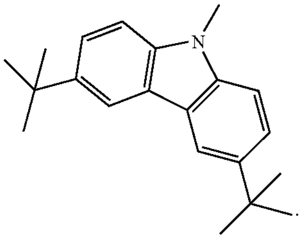
.

In the present disclosure, the multiple resonance fluorescent material may be selected from one of structures of Formula C-1 to Formula C-19:

Formula C-1

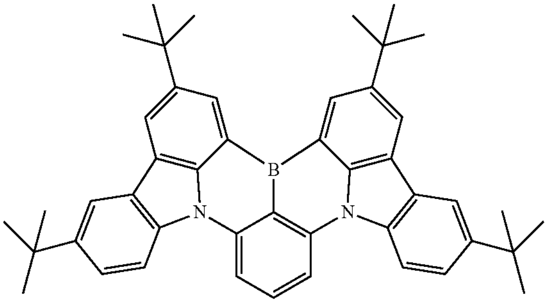

Formula C-2

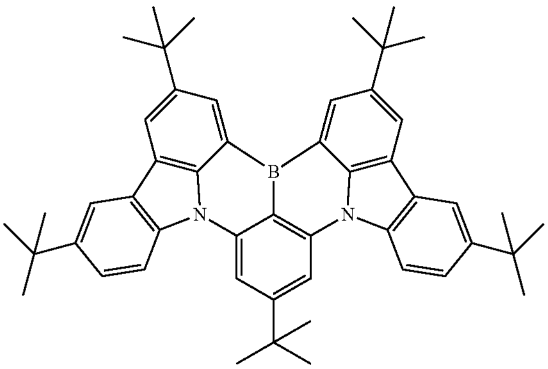

-continued
Formula C-3
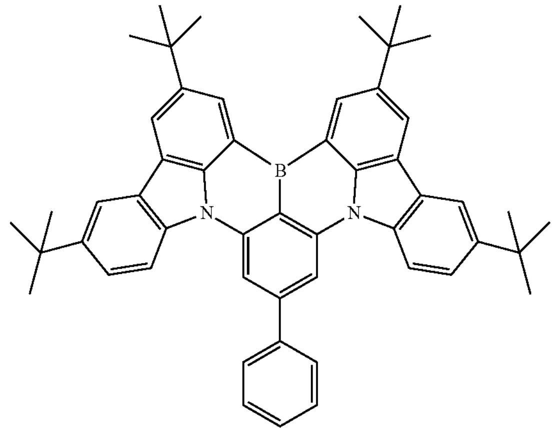
Formula C-4
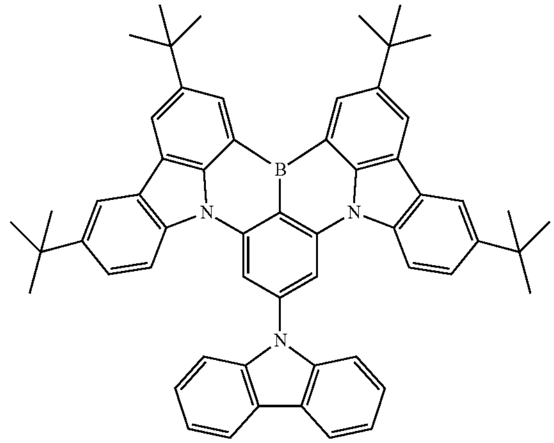
Formula C-5
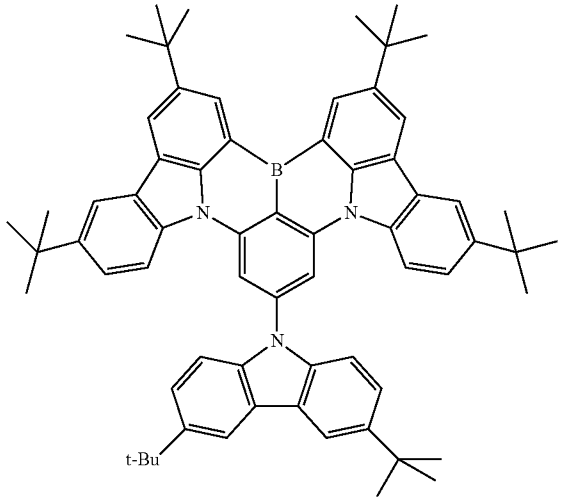
-continued
Formula C-6
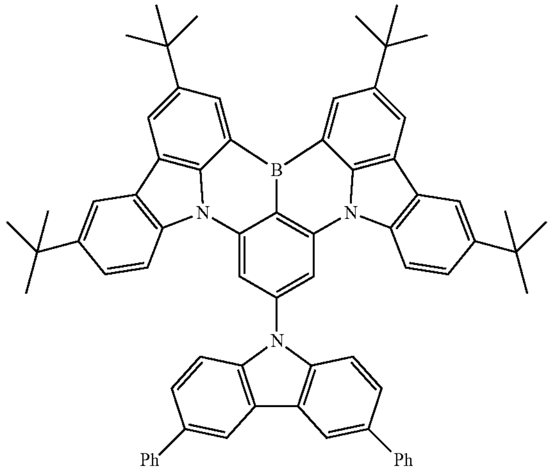
Formula C-7
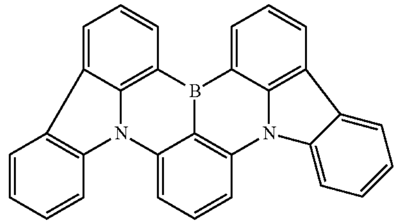
Formula C-8
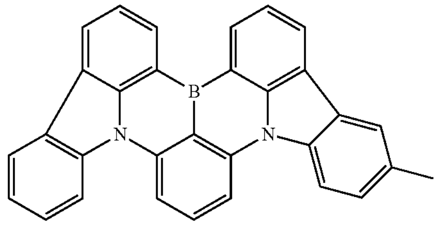
Formula C-9
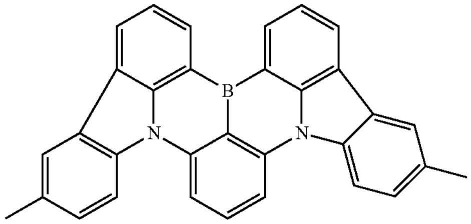
Formula C-10
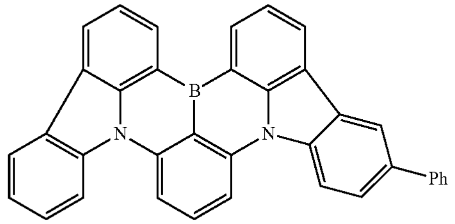

-continued
Formula C-11
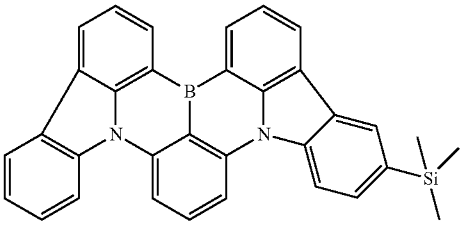
Formula C-12
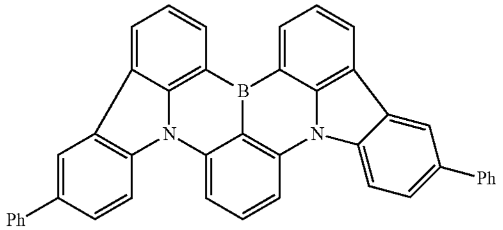
Formula C-13
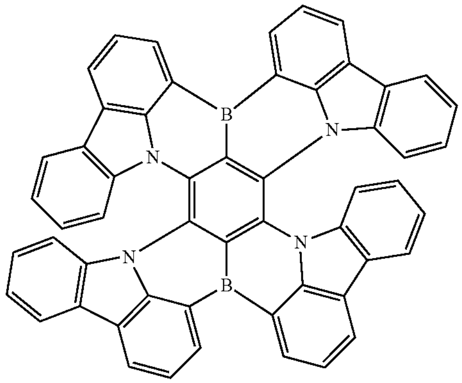
Formula C-14
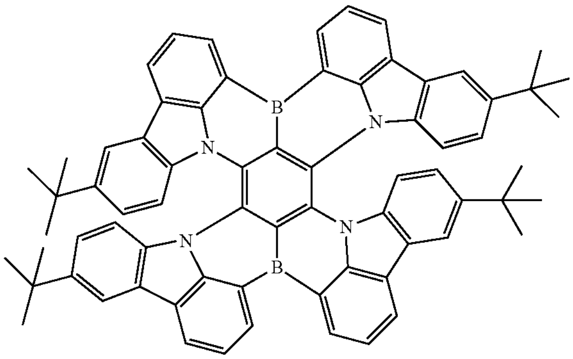
-continued
Formula C-15
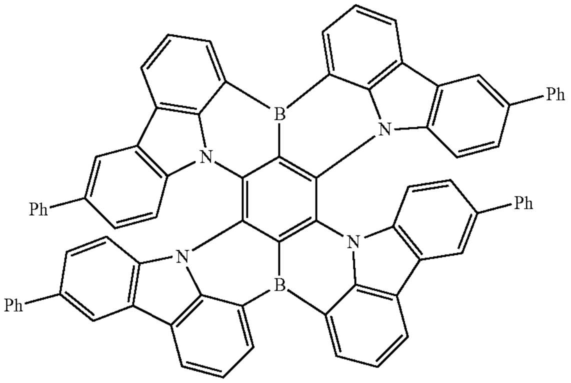
Formula C-16
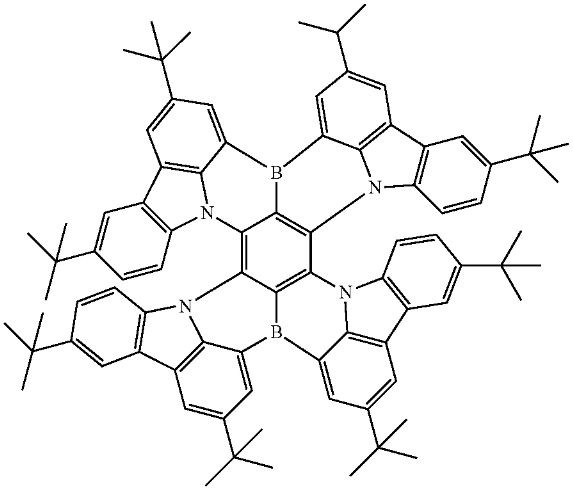
Formula C-17
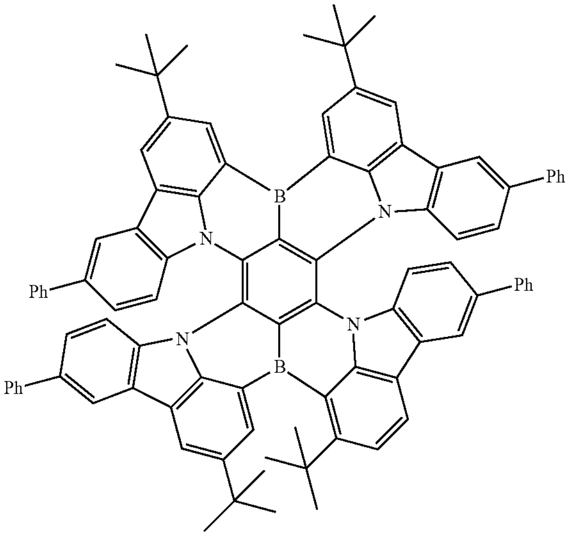

-continued

Formula C-18

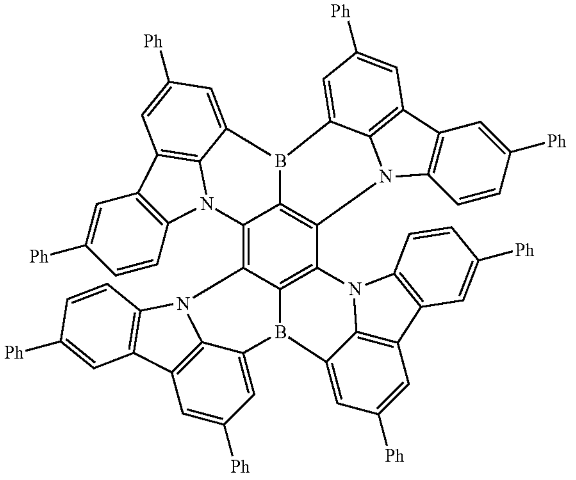

Formula C-19

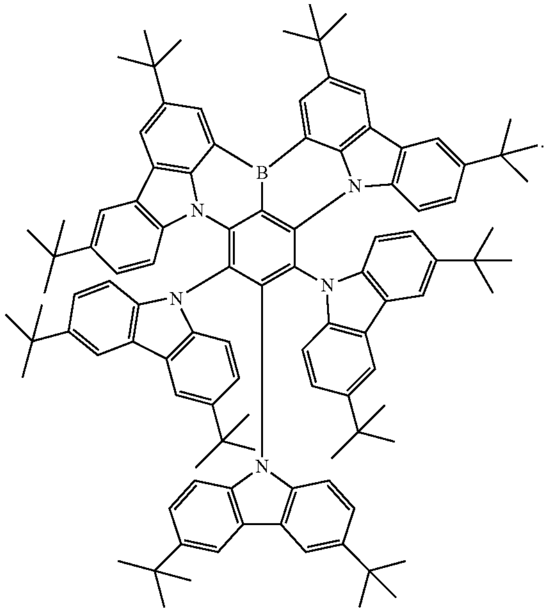

In the present disclosure, in one embodiment, the host material may have the structure of Formula D:

Formula D

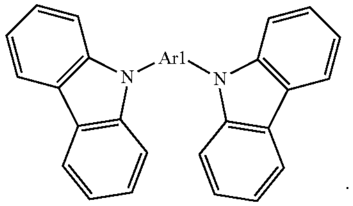

In the Formula D, Ar1 may be selected from substituted or unsubstituted aryl, and substituted or unsubstituted heteroaryl.

In the present disclosure, the Ar1 may be selected from following structures:

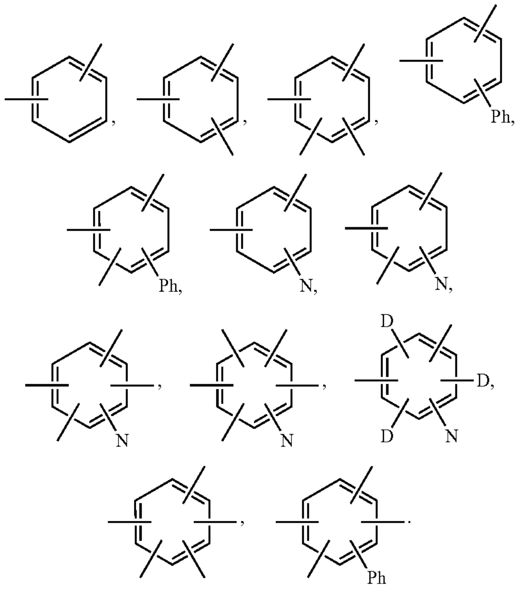

In the present disclosure, the host material may be selected from one or more structures of Formula D-1 to Formula D-36:

Formula D-1

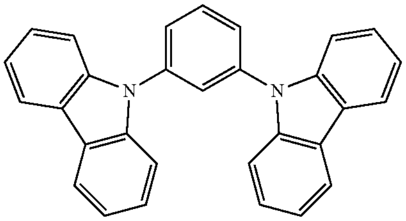

Formula D-2

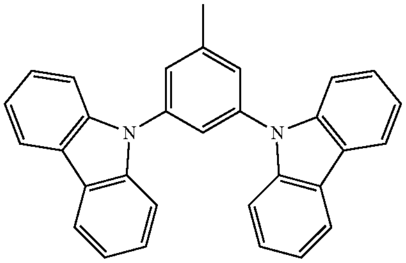

Formula D-3

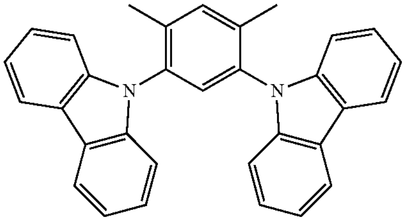

-continued
Formula D-4
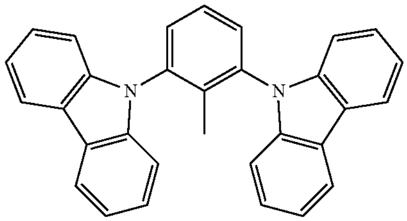
Formula D-5
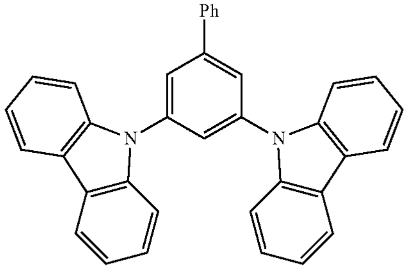
Formula D-6
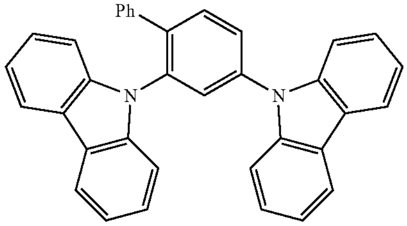
Formula D-7
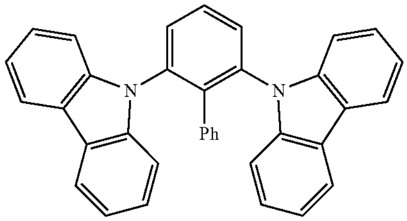
Formula D-8
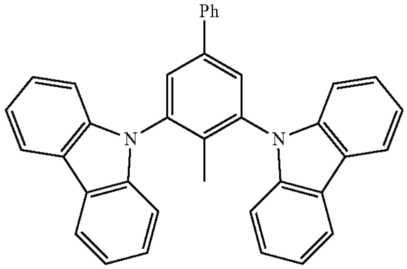
Formula D-9
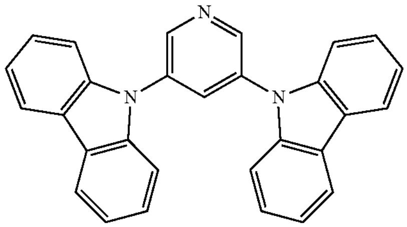
-continued
Formula D-10
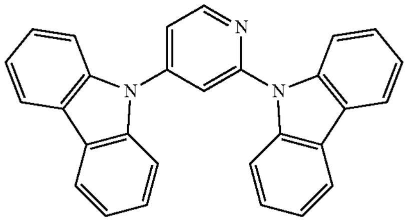
Formula D-11
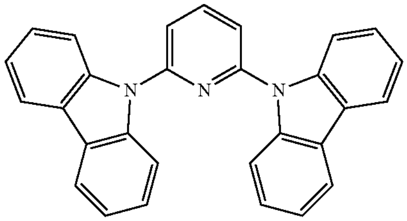
Formula D-12
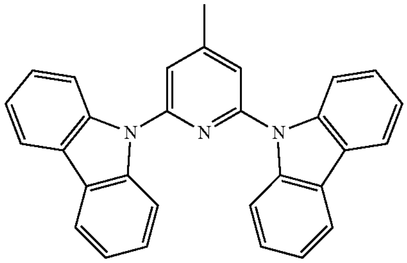
Formula D-13
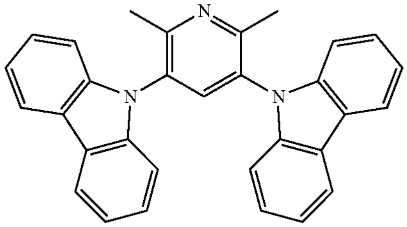
Formula D-14
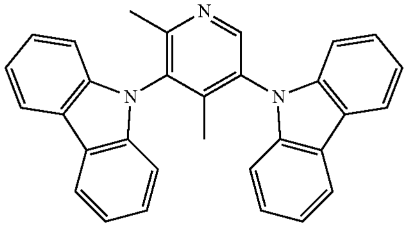
Formula D-15
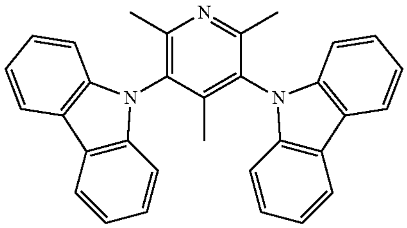

-continued
Formula D-16
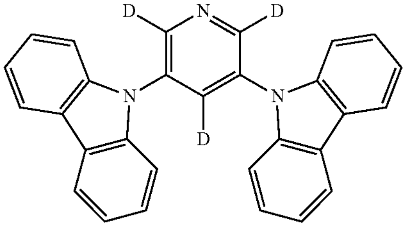
Formula D-17
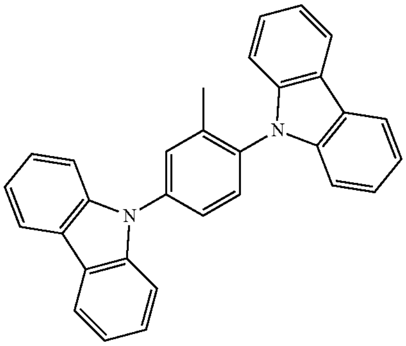
Formula D-18
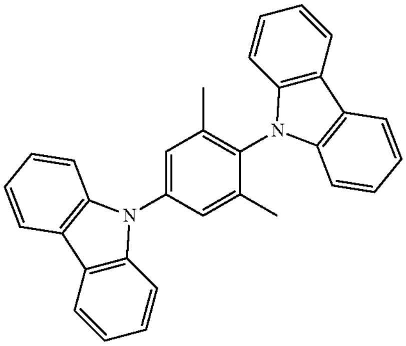
Formula D-19
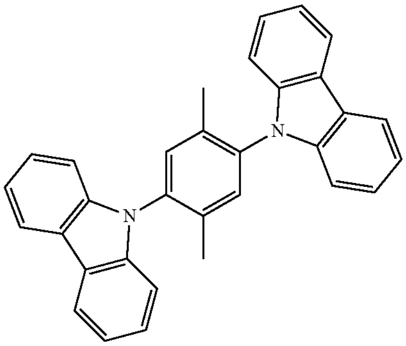
Formula D-20
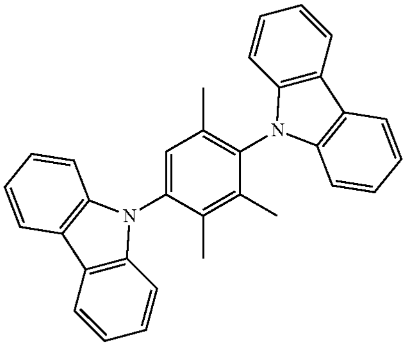
-continued
Formula D-21
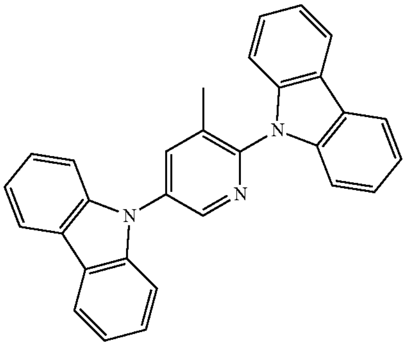
Formula D-22
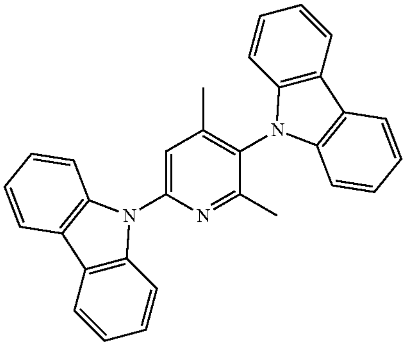
Formula D-23
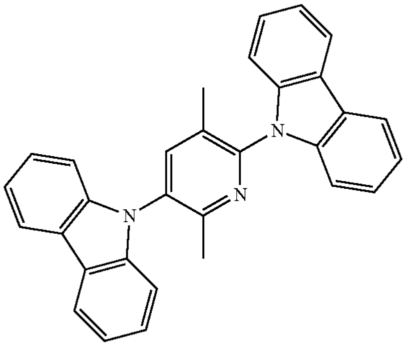
Formula D-24
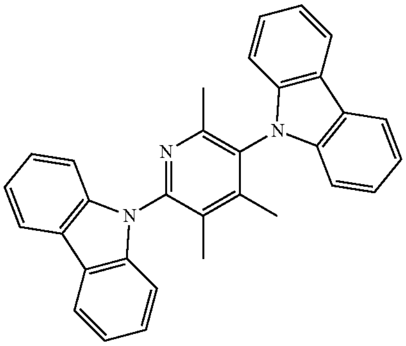

-continued
Formula D-25
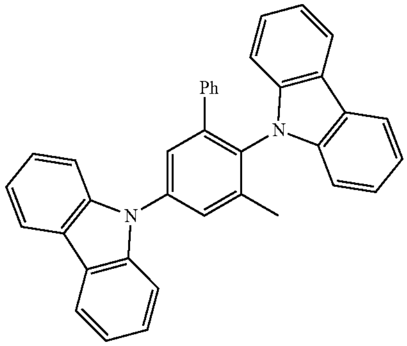
Formula D-26
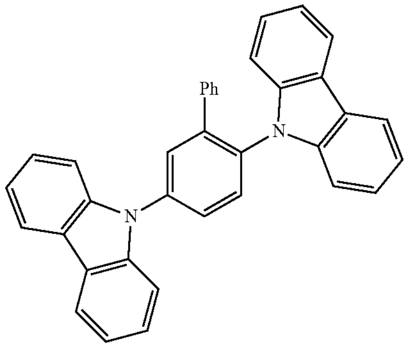
Formula D-27
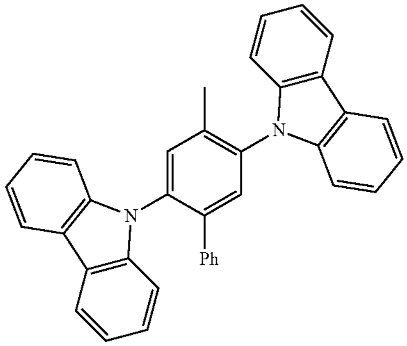
Formula D-28
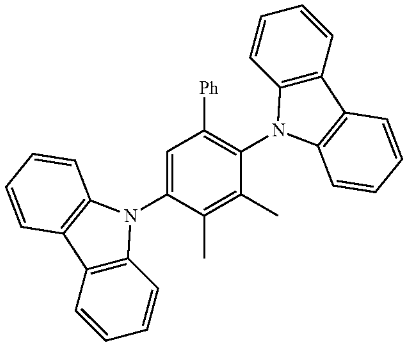
-continued
Formula D-29
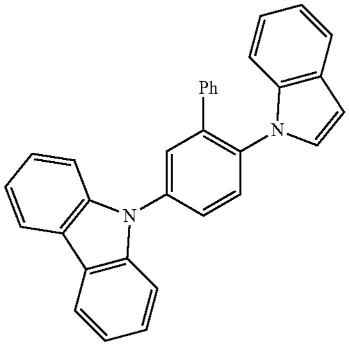
Formula D-30
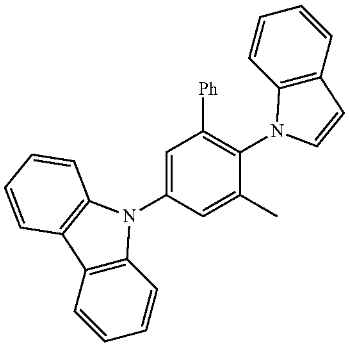
Formula D-31
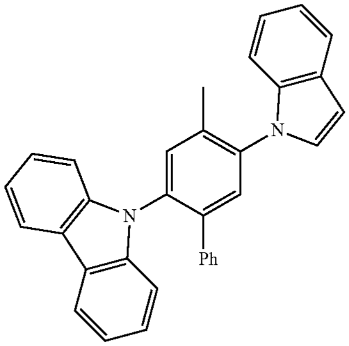
Formula D-32
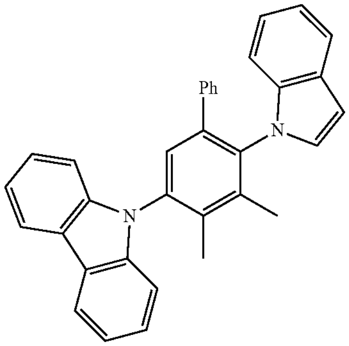

-continued

Formula D-33

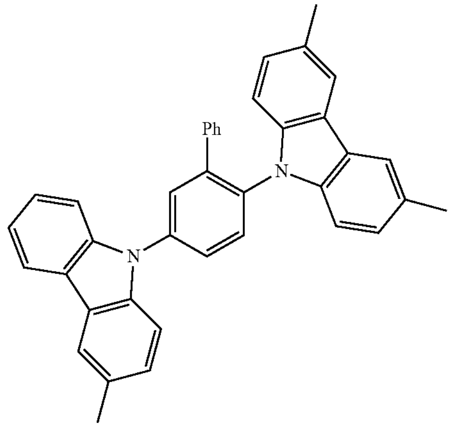

Formula D-34

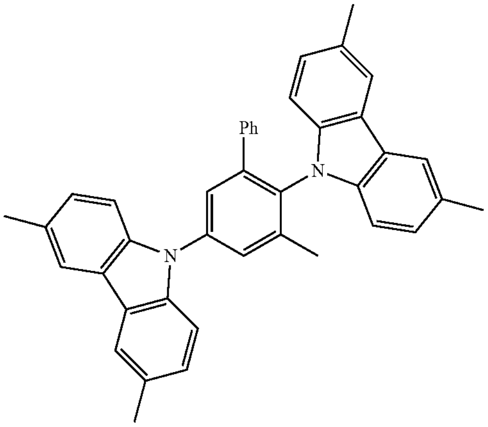

Formula D-35

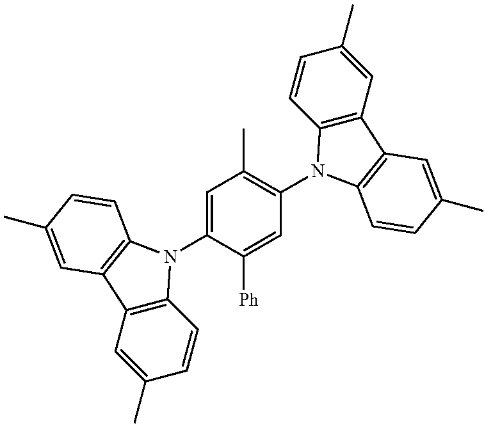

-continued

Formula D-36

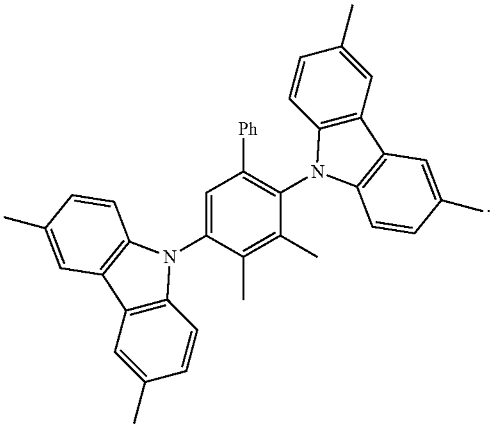

In the present disclosure, the TADF material and the host material may be replaced by exciplex with TADF characteristic made of P-type host material and N-type host material. The P-type host material may be denoted as H1, and the N-type host material may be denoted as H2. The LUMO, HOMO, and T1 energy levels of the P-type host material and the N-type host material may satisfy the following relationship to form the exciplex:

$$\mathrm{Min}\{\mathrm{LUMO(H1)}-\mathrm{HOMO(H2)},\ \mathrm{LUMO(H2)}-\mathrm{HOMO(H1)}\}\leq\mathrm{Min}\{\mathrm{T1(H1)},\ \mathrm{T1(H2)}\}+0.1\ \mathrm{eV}.$$

In the present disclosure, in one embodiment, the P-type host material may have the structure of Formula E:

Formula E

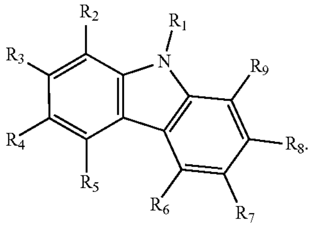

In the Formula E, $R_1$-$R_9$ may be independently selected from substituted or unsubstituted C1-C18 alkyl, such as substituted or unsubstituted C5-C15 alkyl, and substituted or unsubstituted C8-C12 alkyl; may be selected from substituted or unsubstituted C6-C60 aryl group, such as substituted or unsubstituted C10-C50 aryl group, substituted or unsubstituted C20-C40 aryl group, and substituted or unsubstituted C30 aryl group; may be selected from substituted or unsubstituted C5-C60 heteroaryl, such as substituted or unsubstituted C10-C50 heteroaryl, substituted or unsubstituted C20-C40 heteroaryl, and substituted or unsubstituted C30 heteroaryl; may be selected from substituted or unsubstituted deuterated C1-C18 alkyl, such as substituted or unsubstituted deuterated C5-C15 alkyl, and substituted or unsubstituted deuterated C8-C12 alkyl; may be selected from substituted or unsubstituted deuterated C6-C60 aryl, such as substituted or unsubstituted deuterated C10-C50 aryl, substituted or unsubstituted deuterated C20-C40 aryl, and substituted or unsubstituted deuterated C30 aryl; and may be selected from substituted or unsubstituted deuterated C5-C60 heteroaryl, such as substituted or unsubstituted deuterated C10-C50 heteroaryl, substituted or unsubstituted deuterated C20-C40 heteroaryl, and substituted or unsubstituted deuterated C30 heteroaryl.

In the present disclosure, the substituted groups in $R_1$-$R_9$ of the Formula E may be independently selected from fluorine, methyl, ethyl, tert-butyl, phenyl, naphthyl, phenanthryl, pyrenyl, pyridyl, quinolinyl, isoquinolinyl, phenanthridine, phenanthroline, carbazolyl, indolyl, thienyl, imidazolyl, thiazolyl or pyrrolyl.

In the present disclosure, the P-type host material may be selected from one or more of structures of Formulas E-1 to E-9:

Formula E-1

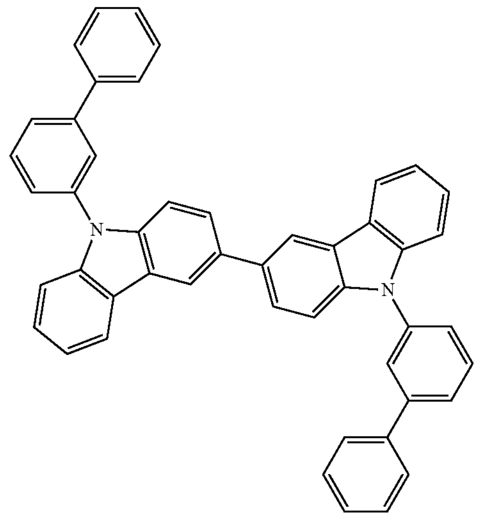

Formula E-2

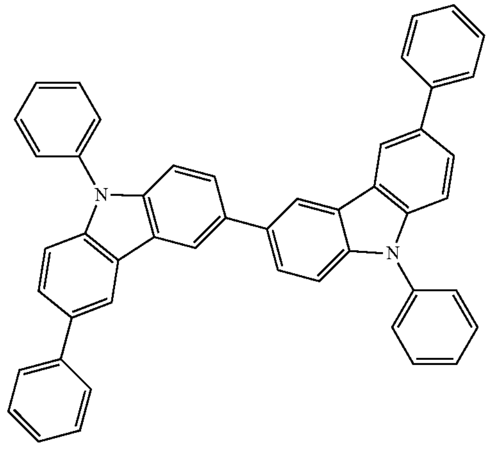

-continued

Formula E-3

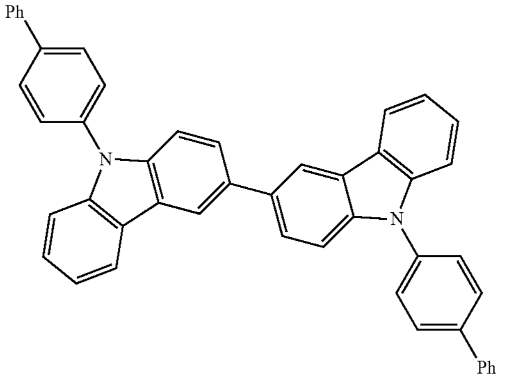

Formula E-4

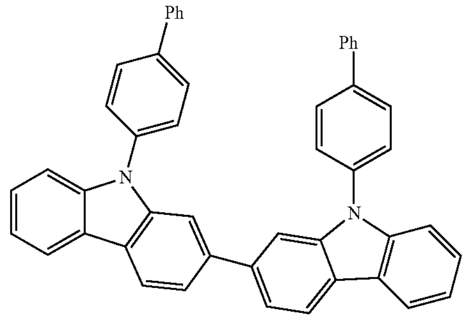

Formula E-5

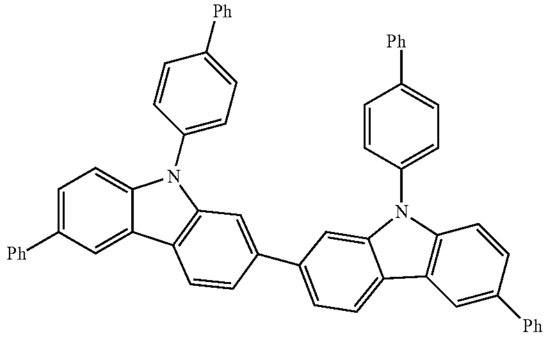

Formula E-6

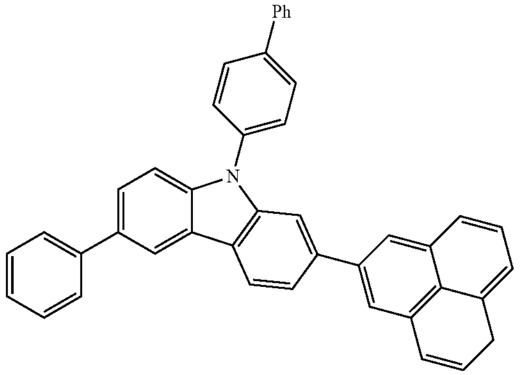

-continued

Formula E-7

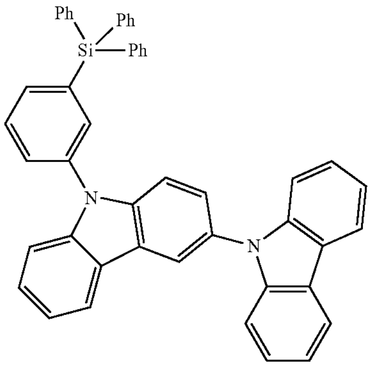

Formula E-8

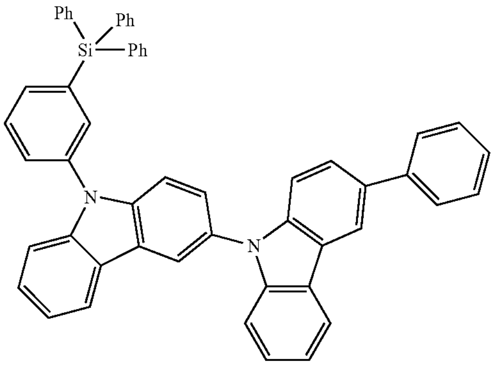

Formula E-9

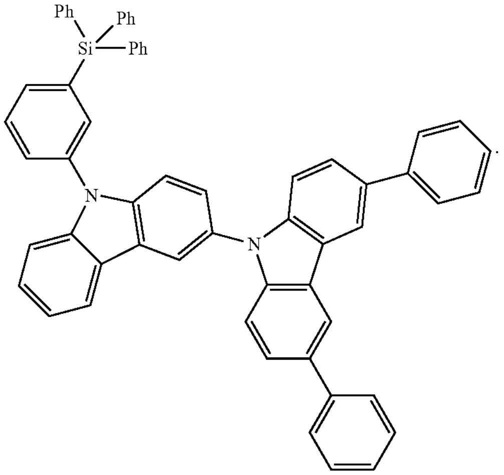

In the present disclosure, in one embodiment, the N-type host material may have the structure of Formula F1 or Formula F2:

Formula F1

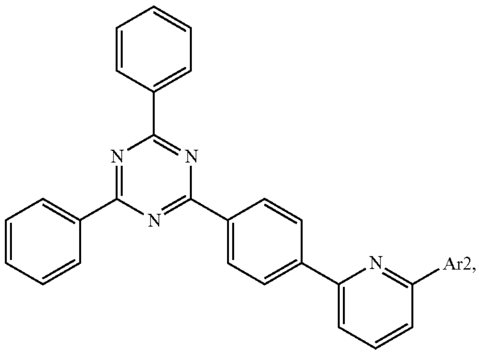

where in the Formula F1, Ar2 may be selected from naphthyl or N-substituted naphthyl; and Formula F2

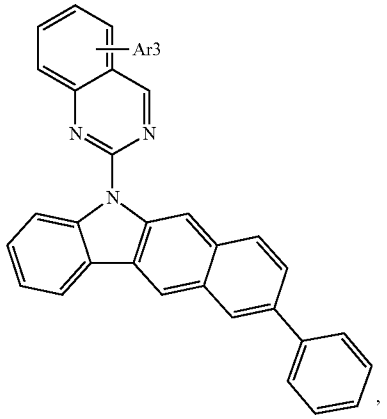

where in Formula F2, Ar3 may be selected from phenyl or N-substituted phenyl.

In the present disclosure, the N-type host material may be selected from one or more structures of Formulas F-1 to F12:

Formula F-1

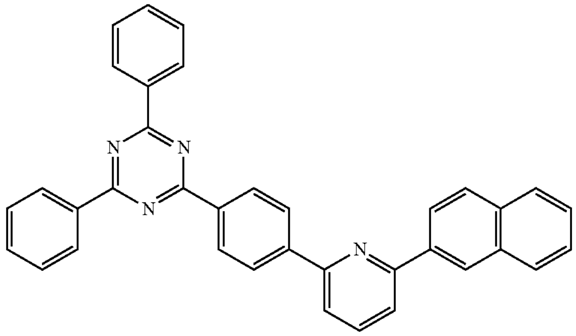

-continued
Formula F-2
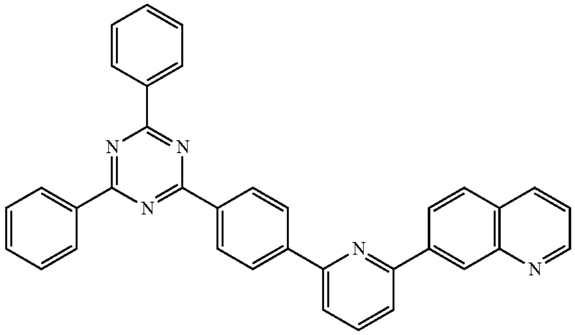
Formula F-3
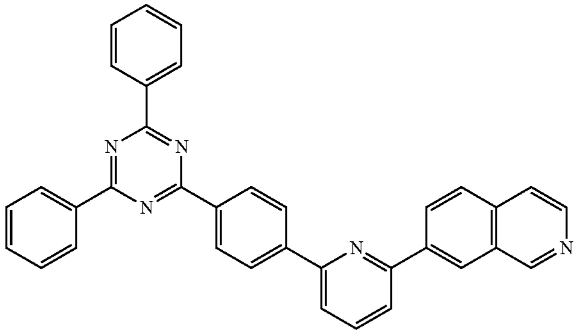
Formula F-4
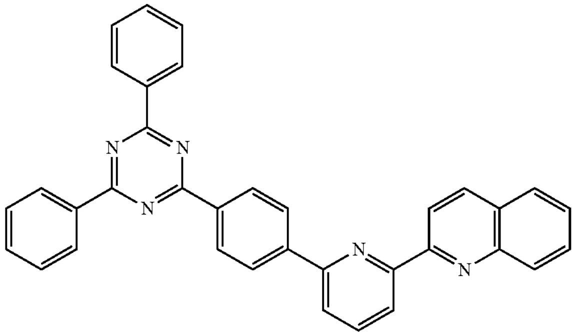
Formula F-5
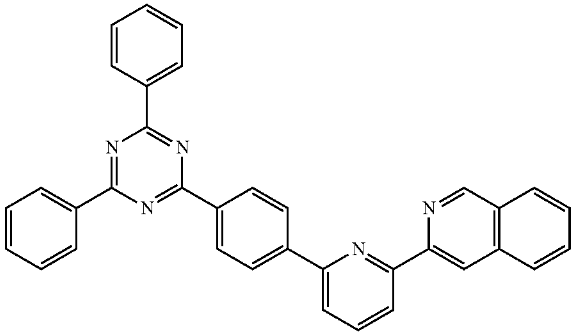
-continued
Formula F-6
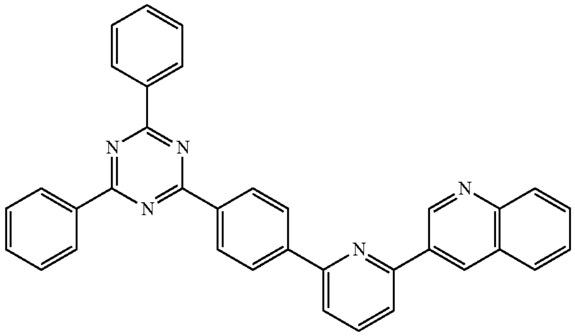
Formula F-7
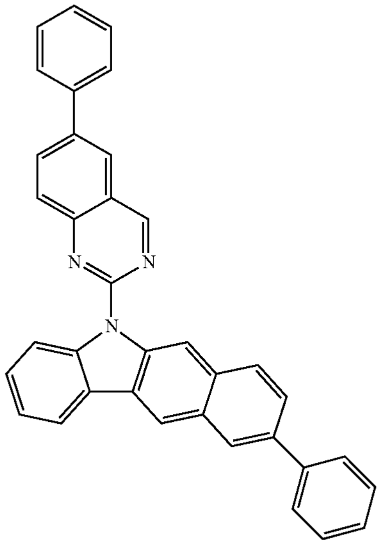
Formula F-8
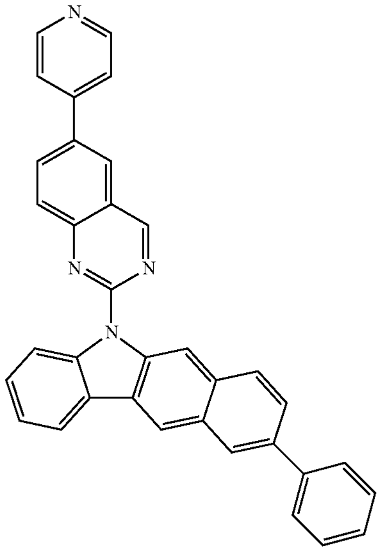

-continued

Formula F-9

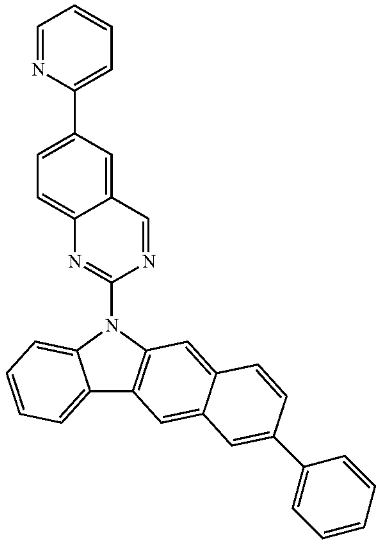

Formula F-10

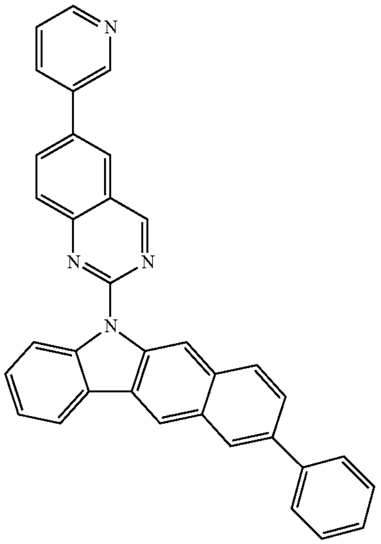

Formula F-11

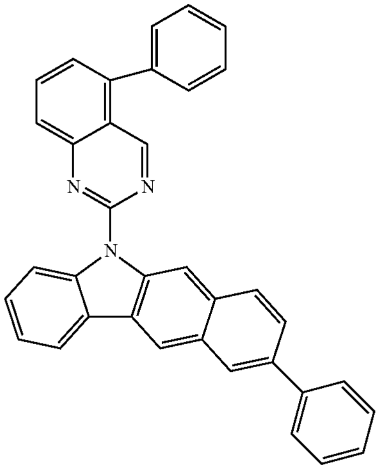

-continued

Formula F-12

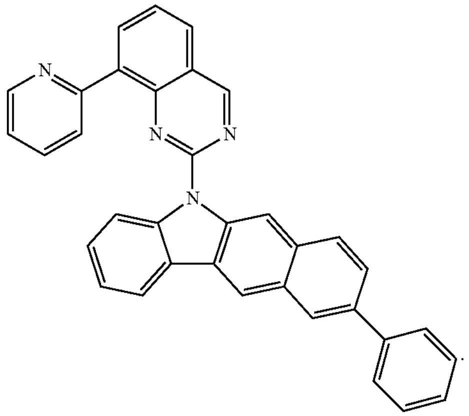

In the present disclosure, a mass ratio of the P-type host material over the N-type host material may be in a range of approximately (10-90):(90-10), such as (20-80):(80-20), (30-70):(70-30), (40-60):(60-40), or 50:50.

In the present disclosure, a mass content of the TADF material in the light-emitting layer may be in a range of approximately 10-60%, such as 20-50%, or 30-40%. A mass content of the phosphorescent material in the light-emitting layer may be in a range of approximately 1-10%, such as 2-8%, or 3-6%. A mass content of the multiple resonance fluorescent material in the light-emitting layer may be in a range of approximately 0.2-2%, such as 0.2-2%, 0.5-1.5%, or 0.8-1.2%. A mass content of the host material in the light-emitting layer may be in a range of approximately 10-80%, such as 20-60%, or 30-50%.

In the present disclosure, the addition amount of the multiple resonance fluorescent material may be reduced to approximately 1 wt %, which may weaken the process of transferring the triplet excitons from the host material to the multiple resonance fluorescent material through DEXTER energy transfer.

In the present disclosure, a thickness of the light-emitting layer may be in a range of approximately 10-50 nm, such as 20-40 nm, or 30 nm.

In the present disclosure, the preparation method of the light-emitting layer may be selected from one or more of thermal evaporation, thermal transfer printing and inkjet printing.

In the present disclosure, during the thermal evaporation process, the raw materials of the light-emitting layer (including the TADF material, the phosphorescent material, the multiple resonance fluorescent material and the host material) may be heated up to reach a preset evaporation rate, the evaporation rate may be kept stable for 20 seconds, then the evaporation shutter may be turned on to allow each material to be deposited on the substrate, and the evaporation may stop after reaching a desired film thickness.

In the present disclosure, during the thermal transfer printing process, the roll material of the raw material of the light-emitting layer (including the TADF material, the phosphorescent material, the multiple resonance fluorescent material and the host material) may be heated while being rotated close to the substrate, such that the raw material may be transferred to the substrate.

In the present disclosure, during the inkjet printing process, the solution of the raw materials of the light-emitting layer (including the TADF material, the phosphorescent material, the multiple resonance fluorescent material and the host material) may be sprayed onto the substrate through electrostatic attraction to form the required light-emitting layer.

The present disclosure provides a light-emitting device. The light-emitting device may include the above-disclosed light-emitting layer.

In the present disclosure, the light-emitting device may further include one or more of capping layer, cathode, electron injection layer, electron transport layer, hole blocking layer, electron blocking layer, hole transport layer, hole injection layer and anode.

Figure 3:
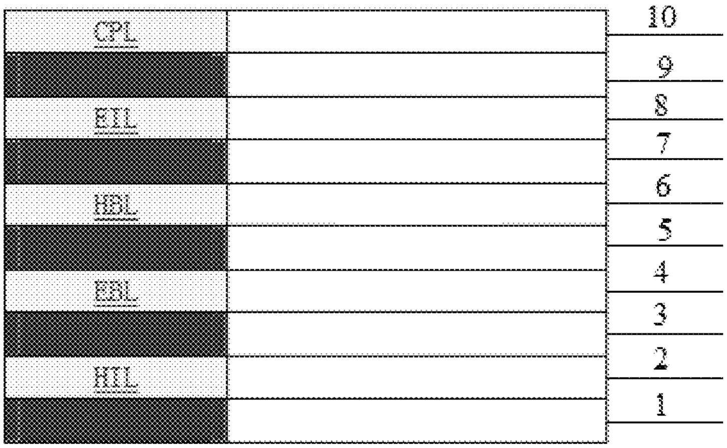
FIG. 3 illustrates a schematic diagram of an OLED device consistent with disclosed embodiments of the present disclosure.

In the present disclosure, the structure of the light-emitting device may be shown in FIG. 3. The light-emitting device may include an anode (1), a hole injection layer (2) disposed on a surface of the anode, a hole transport layer (3) disposed on a surface of the hole transport layer, an electron blocking layer (4) disposed on a surface of the hole transport layer, a light-emitting layer (5) disposed on a surface of the electron blocking layer, a hole blocking layer (6) disposed on a surface of the light-emitting layer, an electron transport layer (7) disposed on a surface of the hole blocking layer, an electron injection layer (8) disposed on a surface of the electron transport layer, a cathode (9) disposed on a surface of the electron injection layer, and a capping layer (10) disposed on a surface of the cathode.

In the present disclosure, the anode may be a composite anode made of ITO/silver/ITO. A thickness of the silver film may be in a range of approximately 100 nm-200 nm, such as 120 nm-180 nm, or 140 nm-160 nm. A thickness of the ITO film may be in a range of approximately 5 nm-200 nm, such as 10 nm-180 nm, 30 nm-150 nm, 50 nm-120 nm, and 80 nm-100 nm.

In the present disclosure, the hole injection layer may be made of a material selected from HTACN, radialene, and phthalo bronze compounds. A thickness of the hole injection layer may be in a range of approximately 1 nm-50 nm, such as 5 nm-40 nm, 10 nm-30 nm, or 20 nm.

In the present disclosure, the hole transport layer may be made of a material selected from NPB, NPD and any other aromatic amine organic compound. A thickness of the hole transport layer may be in a range of approximately 10 nm-200 nm, such as 20 nm-150 nm, 50 nm-120 nm, and 80 nm-100 nm.

In the present disclosure, the electron blocking layer may be made of a material selected from TCTA and any other carbazole compound with high singlet-triplet energy level difference. A thickness of the electron blocking layer may be in a range of approximately 1 nm-50 nm, such as 5 nm-40 nm, 10 nm-30 nm, and 20 nm.

In the present disclosure, the light-emitting layer may be formed according to the above-disclosed methods, and details may not be repeated herein.

In the present disclosure, the hole transport layer may be made of a material selected from TPBI, and any other amine-based compound. A thickness of the hole transport layer may be in a range of approximately 1 nm-10 nm, such as 2 nm-8 nm, 3 nm-6 nm, and 4 nm-5 nm.

In the present disclosure, the electron transport layer may be made of a material selected from triazine compounds. A thickness of the electron transport layer may be in a range of approximately 10 nm-50 nm, such as 20 nm-40 nm, and 30 nm.

In the present disclosure, the electron injection layer may be made of a material selected from lithium fluoride, ytterbium and any other compound. A thickness of the electron injection layer may be in a range of approximately 1 nm-10 nm, such as 2 nm-8 nm, 3 nm-6 nm, and 4 nm-5 nm.

In the present disclosure, the cathode may be made of a material selected from silver and magnesium-silver alloy. A thickness of the cathode may be in a range of approximately 10 nm-20 nm, such as 12 nm-18 nm, and 14 nm-16 nm.

In the present disclosure, the capping layer may be made of a material selected from compounds with high refractive index and high ultraviolet light absorption. A thickness of the capping layer may be in a range of approximately 10 nm-100 nm, such as 20 nm-80 nm, 30 nm-60 nm, and 40 nm-50 nm.

The present disclosure provides a light-emitting apparatus. The light-emitting apparatus may include the above-disclosed light-emitting device.

In the present disclosure, the light-emitting device may be selected from a light-emitting display and a lighting equipment.

Exemplary Embodiment 1

The light-emitting device may be prepared according to the following method.

A glass substrate may be ultrasonically cleaned, dried, and put into an evaporation chamber pre-placed with various materials. HTACN may be heated to reach an evaporation rate of 0.1 nm/s, and then may be evaporated onto the substrate to form a film with a thickness of 10 nm. NPB may be heated to reach an evaporation rate of 0.1 nm/s, and then may be evaporated onto the substrate to form a film with a thickness of 60 nm. MCP may be heated to reach an evaporation rate of 0.04 nm/s, 4CzIPN may be heated to reach an evaporation rate of 0.054 nm/s, Ir(ppy)3 may be heated to reach an evaporation rate of 0.0055 nm/s, BBCZ may be heated to reach an evaporation rate of 0.0005 nm/s, and then may be evaporated onto the substrate to form a film with a thickness of 35 nm. Bepq2 may be heated to reach an evaporation rate of 0.1 nm/s, and then may be evaporated onto the substrate to form a film with a thickness of 30 nm. LiF may be heated to reach an evaporation rate of 0.01 nm/s, and then may be evaporated onto the substrate to form a film with a thickness of 1 nm. Aluminum may be heated to reach an evaporation rate of 0.5 nm/s, and then may be evaporated onto the substrate to form a film with a thickness of 100 nm.

The structure of the light-emitting device formed in Embodiment 1 may include HTACN(10)/NPB(60)/2-TNATA(10)/MCP:4CzIPN:Ir(ppy)3:BBCZ(40:54:5.5:0.5, 35)/Bepq2(30)/LiF(1)/Al(100).

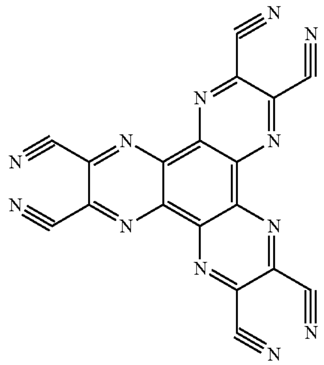

HTACN

-continued

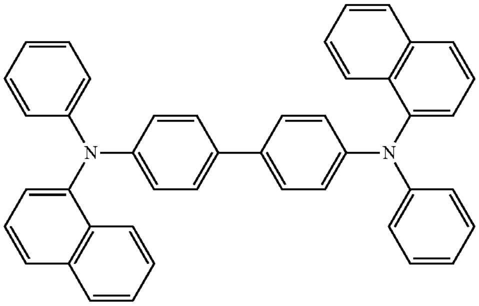

NPB

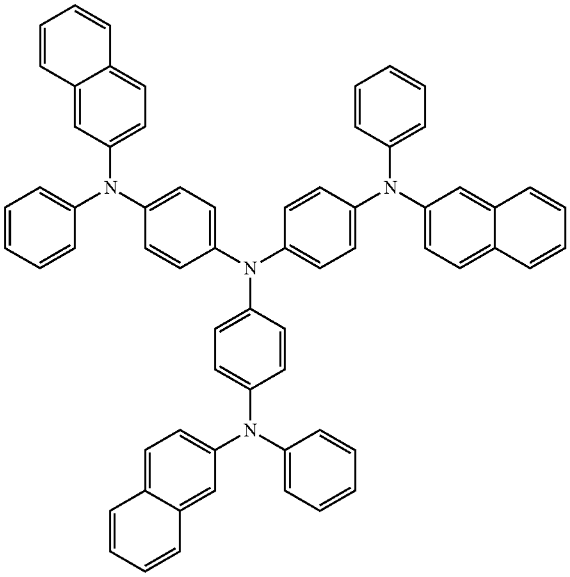

2-TNATA

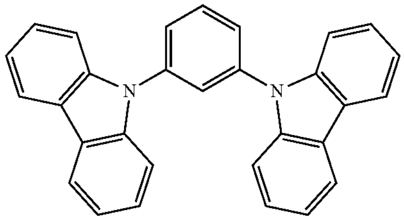

MCP

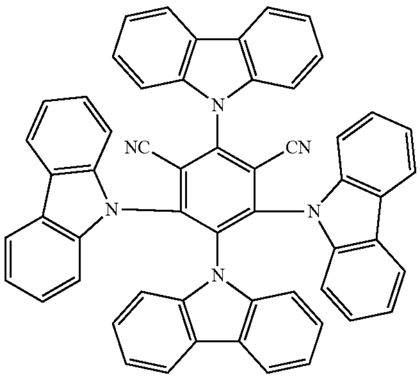

4CzIPN

-continued

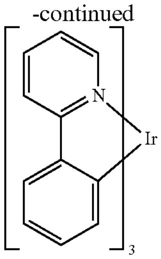

Ir(ppy)3

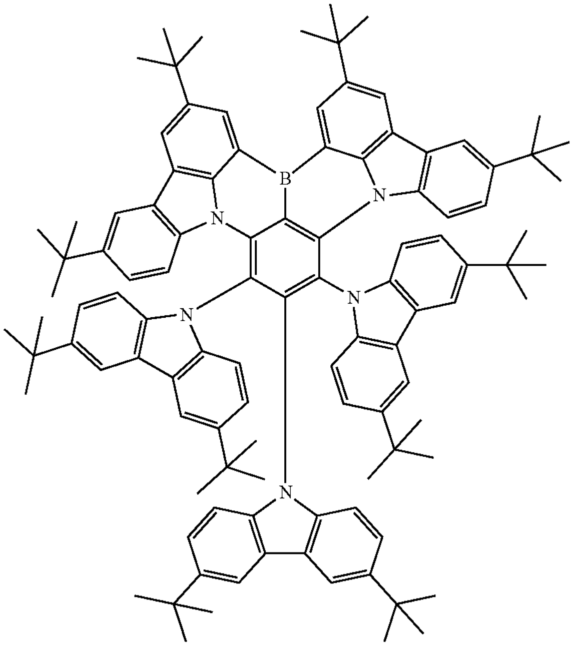

BBCZ

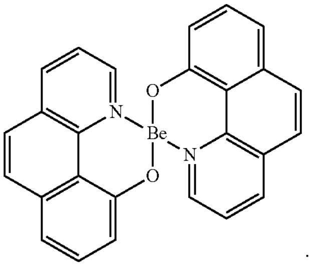

Bepq2

Exemplary Embodiment 2

The light-emitting device may be prepared according to the following method.

A glass substrate may be ultrasonically cleaned, dried, and put into an evaporation chamber pre-placed with various materials. HTACN may be heated to reach an evaporation rate of 0.1 nm/s, and then may be evaporated onto the substrate to form a film with a thickness of 10 nm. NPB may be heated to reach an evaporation rate of 0.1 nm/s, and then may be evaporated onto the substrate to form a film with a thickness of 60 nm. BBBC may be heated to reach an evaporation rate of 0.04 nm/s, Formula F-1 compound may be heated to reach an evaporation rate of 0.054 nm/s, Ir(ppy)3 may be heated to reach an evaporation rate of 0.0055 nm/s, BBCZ may be heated to reach an evaporation rate of 0.0005 nm/s, and then may be evaporated onto the substrate to form a film with a thickness of 35 nm. Bepq2 may be heated to reach an evaporation rate of 0.1 nm/s, and then may be evaporated onto the substrate to form a film with a thickness of 30 nm. LiF may be heated to reach an evaporation rate of 0.01 nm/s, and then may be evaporated onto the substrate to form a film with a thickness of 1 nm. Aluminum may be heated to reach an evaporation rate of 0.5 nm/s, and then may be evaporated onto the substrate to form a film with a thickness of 100 nm.

The structure of the light-emitting device formed in Embodiment 2 may include HTACN(10)/NPB(60)/2-TNATA(10)/BBBC:compound F-1:Ir(ppy)3:BBCZ (40:54:5.5:0.5, 35)/Bepq2(30)LiF(1)/Al(100).

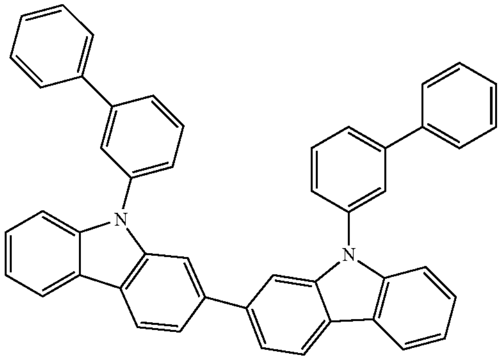

BBBC

Formula F-1

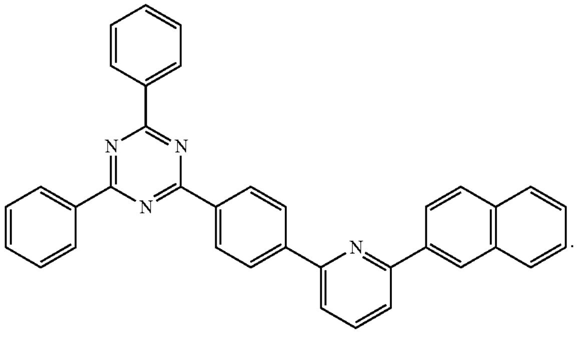

.

Exemplary Embodiments 3-7

The light-emitting device in Embodiments 3-7 may be prepared according to the method in Embodiment 1, and the difference between Embodiments 3-7 and Embodiment 1 may include that the light-emitting layer may be made of different materials.

The structure of the light-emitting device formed in Embodiment 3 may include HTACN(10)/NPB(60)/2-TNATA(10)/HOST1(compound D-1):TADF1(compound A-1):PhD1(compound B-1):FD1(compound C-1)(40:54:5.5:0.5, 35)/Bepq2(30)/LiF(1)/Al(100).

The structure of the light-emitting device formed in Embodiment 4 may include HTACN(10)/NPB(60)/2-TNATA(10)/HOST2(compound D-2):TADF2(compound A-2):PhD2(compound B-2):FD2(compound C-2)(40:54:5.5:0.5, 35)/Bepq2(30)/LiF(1)/Al(100).

The structure of the light-emitting device formed in Embodiment 5 may include HTACN(10)/NPB(60)/2-TNATA(10)/HOST3(compound D-3):TADF3(compound A-3):PhD3(compound B-3):FD3(compound C-3)(40:54:5.5:0.5, 35)/Bepq2(30)/LiF(1)/Al(100).

The structure of the light-emitting device formed in Embodiment 6 may include HTACN(10)/NPB(60)/2-TNATA(10)/HOST4(compound D-4):TADF4(compound A-4):PhD4(compound B-4):FD4(compound C-4)(40:54:5.5:0.5, 35)/Bepq2(30)/LiF(1)/Al(100).

The structure of the light-emitting device formed in Embodiment 7 may include HTACN(10)/NPB(60)/2-TNATA(10)/HOST5(compound D-5):TADF5(compound A-5):PhD5(compound B-5):FD5(compound C-5)(40:54:5.5:0.5, 35)/Bepq2(30)/LiF(1)/Al(100).

Exemplary Embodiments 8-12

The light-emitting device in Embodiments 8-12 may be prepared according to the method in Embodiment 2, and the difference between Embodiments 8-12 and Embodiment 2 may include that the light-emitting layer may be made of different materials.

The structure of the light-emitting device formed in Embodiment 8 may include HTACN(10)/NPB(60)/2-TNATA(10)/P-HOST1(compound E-1):N-HOST1(compound F-1):PhD1(compound B-1):FD1(compound C-1)(40:54:5.5:0.5, 35)/Bepq2(30)/LiF(1)/Al(100).

The structure of the light-emitting device formed in Embodiment 9 may include HTACN(10)/NPB(60)/2-TNATA(10)/P-HOST2(compound E-2):N-HOST2(compound F-2):PhD2(compound B-2):FD2(compound C-2)(40:54:5.5:0.5, 35)/Bepq2(30)/LiF(1)/Al(100).

The structure of the light-emitting device formed in Embodiment 10 may include HTACN(10)/NPB(60)/2-TNATA(10)/P-HOST3(compound E-3):N-HOST3(compound F-3):PhD3(compound B-3):FD3(compound C-3)(40:54:5.5:0.5, 35)/Bepq2(30)/LiF(1)/Al(100).

The structure of the light-emitting device formed in Embodiment 11 may include HTACN(10)/NPB(60)/2-TNATA(10)/P-HOST4(compound E-4):N-HOST4(compound F-4):PhD4(compound B-4):FD4(compound C-4)(40:54:5.5:0.5, 35)/Bepq2(30)/LiF(1)/Al(100).

The structure of the light-emitting device formed in Embodiment 12 may include HTACN(10)/NPB(60)/2-TNATA(10)/P-HOST5(compound E-5):N-HOST5(compound F-5):PhD5(compound B-5):FD5(compound C-5)(40:54:5.5:0.5, 35)/Bepq2(30)/LiF(1)/Al(100).

Comparative Embodiments 13-14

The light-emitting device in Embodiments 13-14 may be prepared according to the method in Embodiment 1, and the difference between Embodiments 13-14 and Embodiment 1 may include that the light-emitting layer may be made of different materials.

The structure of the light-emitting device formed in Embodiment 13 may include HTACN(10)/NPB(60)/2-TNATA(10)MCP:4CzIPN:BBCZ(40:59.5:0.5, 35)/Bepq2(30)/LiF(1)/Al(100).

The structure of the light-emitting device formed in Embodiment 14 may include HTACN(10)/NPB(60)/2-TNATA(10)/MCP:BBCZ(0.5%, 35)/Bepq2(30)/LiF(1)/Al(100).

Comparative Embodiment 15

The light-emitting device in Embodiment 15 may be prepared according to the method in Embodiment 2, and the difference between Embodiment 15 and Embodiment 2 may include that the light-emitting layer may be made of a different material.

The structure of the light-emitting device formed in Embodiment 15 may include HTACN(10)/NPB(60)/2-TNATA(10)/BBBC:compound F-1:BBCZ(40:59.5: 0.5, 35)/Bepq2(30)/LiF(1)/Al(100).

Performance Testing

Photoelectric performance test may be performed on the light-emitting devices prepared in the exemplary Embodiments and comparative Embodiments. The spectrophotometer is Konica Minolta CS2000, and the current source is Keithley 2400. Driven by a constant current density of 10 mA/cm$^2$, the device performance may include following. The external quantum efficiency of the device may be calculated from the obtained spectrum, and the device life may be tested at a current density of 50 mA/cm$^2$.

| | External quantum efficiency (%) | Half width of the spectrum (nm) | Life (h) |
|---|---|---|---|
| Embodiment 1 | 18.2 | 22 | 100 |
| Embodiment 2 | 17.6 | 22 | 122 |
| Embodiment 3 | 19.3 | 27 | 98 |
| Embodiment 4 | 18.4 | 20 | 86 |
| Embodiment 5 | 17.9 | 19 | 99 |
| Embodiment 6 | 16.8 | 23 | 113 |
| Embodiment 7 | 18.8 | 26 | 156 |
| Embodiment 8 | 20.1 | 27 | 132 |
| Embodiment 9 | 19.8 | 20 | 143 |
| Embodiment 10 | 17.5 | 19 | 122 |
| Embodiment 11 | 18.5 | 23 | 95 |
| Embodiment 12 | 17.8 | 26 | 107 |
| Embodiment 13 | 14.6 | 36 | 10 |
| Embodiment 14 | 4.6 | 26 | 78 |
| Embodiment 15 | 15.1 | 45 | 21 |

The preparation raw materials used in the disclosed embodiments may be dissolved in toluene to form a solution of approximately 1×10$^{-7}$ mol/L. Shimadzu UV-1780 may be used to test the ultraviolet absorption peak of the material. Hitachi fluorescence spectrometer F4600 may be used to test fluorescence peak of the material. In liquid nitrogen cooling environment, the phosphorescence mode of F4600 may be used to test the phosphorescence peak of the material. The testing results may include following.

| Compound | Ultraviolet absorption peak (eV) | Fluorescence peak (eV) | 77K Phosphorescence peak (eV) |
|---|---|---|---|
| A-1 | | 2.43 | 2.41 |
| A-2 | | 2.38 | 2.28 |
| A-3 | | 2.46 | 2.43 |
| A-4 | | 2.51 | 2.36 |
| A-5 | | 2.39 | 2.33 |
| B-1 | 2.52 | 2.36 | 2.36 |
| B-2 | 2.48 | 2.33 | 2.33 |
| B-3 | 2.39 | 2.29 | 2.29 |
| B-4 | 2.49 | 2.31 | 2.31 |
| B-5 | 2.5 | 2.36 | 2.36 |
| C-1 | 2.37 | 2.29 | 1.95 |
| C-2 | 2.34 | 2.24 | 1.78 |
| C-3 | 2.36 | 2.25 | 1.9 |
| C-4 | 2.32 | 2.27 | 2 |
| C-5 | 2.33 | 2.26 | 1.89 |
| D-1 | | 3.1 | 2.67 |
| D-2 | | 3.2 | 2.77 |
| D-3 | | 3.26 | 2.8 |
| D-4 | | 3.42 | 2.92 |
| D-5 | | 3.56 | 2.9 |

Chenhua CHI660 electrochemical workstation with ferrocene as the internal standard may be used to test the HOMO/LUMO energy levels of the material used in the Embodiments. The material of 0.1 g may be dissolved in a pre-prepared solution of tetrabutyl-hexafluoro-phosphoric acid in tetrahydrofuran, and nitrogen gas may be continuously introduced into the solution to remove oxygen from the solution. The testing results may include following.

| Compound | HOMO Energy level (eV) | LUMO Energy level (eV) |
|---|---|---|
| A-1 | −5.33 | −2.2 |
| A-2 | −5.27 | −2.38 |
| A-3 | −5.26 | −2.27 |
| A-4 | −5.21 | −2.29 |
| A-5 | −5.3 | −2.31 |
| B-1 | −5.20 | −2.36 |
| B-2 | −5.18 | −2.31 |
| B-3 | −5.19 | −2.32 |
| B-4 | −5.17 | −2.31 |
| B-5 | −5.19 | −2.34 |
| C-1 | −5.07 | −2.42 |
| C-2 | −5.02 | −2.39 |
| C-3 | −5.01 | −2.37 |
| C-4 | −5.09 | −2.33 |
| C-5 | −5.1 | 2.38 |
| D-1 | −5.44 | −1.98 |
| D-2 | −5.46 | −1.87 |
| D-3 | −5.39 | −2.1 |
| D-4 | −5.55 | −2.31 |
| D-5 | −5.48 | −2.08 |

In Embodiment 1, the luminescence peak of the 4CzIPN material may be red-shifted by less than 0.3 eV with respect to the peak of a minimum absorption band of the Ir(ppy)3 material. The luminescence peak of the 4CzIPN material may be red-shifted by less than 0.3 eV with respect to the absorption peak of the BBCZ material. The luminescence peak of the Ir(ppy)3 material may be red-shifted by less than 0.3 eV with respect to the absorption peak in visible light band of the BBCZ material. The energy difference between the luminescence peak of the energy donor and the absorption peak of the energy acceptor may be substantially small, such that the energy transfer inside the light-emitting layer may be substantially efficient. The difference between the HOMO energy level of the MCP material and the LUMO energy level of the 4CzIPN material may be greater than the triplet energy level of the 4CzIPN material by 0.1 eV. The difference of the LUMO energy level of the MCP material and the HOMO energy level of the 4CzIPN material may be greater than the triplet energy level of the 4CzIPN material by 0.1 eV. The difference of the HOMO energy level of the 4CzIPN material and the LUMO energy level of the BBCZ material may be greater than the triplet energy level of the BBCZ material by 0.1 eV. The difference of the LUMO energy level of the 4CzIPN material and the HOMO energy level of the BBCZ material may be greater than the triplet energy level of the BBCZ material by 0.1 eV.

Through configuring the setting of the HOMO energy levels, LUMO energy levels and triplet energy levels of the above-mentioned different materials, exciplexes may be prevented from being formed to avoid energy deactivation.

Singlet energy level of MCP>singlet energy level of 4CzIPN>singlet energy level of Ir(ppy)3>singlet energy level of BBCZ. Triplet energy level of MCP>triplet energy level of 4CzIPN>triplet energy level of Ir(ppy)3>triplet energy level of BBCZ. Through configuring the setting of the singlet energy levels and triplet energy levels of the materials, high-efficient light emission may be achieved. The difference between the HOMO energy level of the MCP material and the HOMO energy level of the electron blocking layer may be less than 0.3 eV, thereby achieving high-efficient hole injection.

In another embodiment, for the singlet energy level and triplet energy level, the singlet energy levels of the host material, the TADF material, the phosphorescent material and the multiple resonance fluorescent material may sequentially increase, which may satisfy the energy level relationship between the four materials in the present disclosure. The HOMO energy levels may sequentially increase as the singlet energy levels of the host material, the TADF material, the phosphorescent material and the multiple resonance fluorescent material increase. The LUMO energy levels may sequentially decrease as the singlet energy levels of the host material, the TADF material, the phosphorescent material and the multiple resonance fluorescent material decrease. The energy level difference may satisfy the relationship between the four materials in the present disclosure. The energy level difference between the absorption peak and the fluorescence peak between the material may also satisfy the setting of 0.3 eV in the present disclosure. The present disclosure may obtain the above-mentioned device with substantially desired performance.

In Embodiment 1, MCP may transport holes, and 4CzIPN may serve as TADF. Ir(ppy)3 may serve as energy transfer medium, and at the same time, may mix the triplet excitons and singlet excitons to improve the exciton utilization rate. BBCZ may serve as a light-emitting material and may be the multiple resonance material, which may convert a portion of the triplet excitons into singlet excitons. It may be difficult to convert all triplet excitons into singlet excitons due to insufficient crossover rate between inverse systems. Therefore, the addition amount of the BBCZ material may be reduced to approximately 1 wt %, which may weaken the process of transferring the triplet excitons from the host material to the BBCZ material through DEXTER energy transfer.

The TADF material based on the exciplex mechanism may also be tested, and the triplet energy level may use the phosphorescence peak energy at 77K.

The TADF material that conforms to the exciplex mechanism in the disclosed embodiments may also be tested, and the triplet energy level may use the phosphorescence peak energy at 77 K. The testing results may include following.

| Compound | Triplet energy level (eV) | HOMO Energy level (eV) | LUMO Energy level (eV) |
|---|---|---|---|
| E-1 | 2.44 | −5.26 | −2.33 |
| E-2 | 2.24 | −5.23 | −2.35 |
| E-3 | 2.31 | −5.16 | −2.26 |
| E-4 | 2.28 | −5.25 | −2.31 |
| E-5 | 2.51 | −5.26 | −2.22 |
| F-1 | 2.42 | −5.03 | −2.86 |
| F-2 | 2.31 | −5.17 | −2.93 |

-continued

| Compound | Triplet energy level (eV) | HOMO Energy level (eV) | LUMO Energy level (eV) |
|---|---|---|---|
| F-3 | 2.37 | −5.22 | −2.82 |
| F-4 | 2.30 | −5.19 | −2.93 |
| F-5 | 2.53 | −5.25 | −2.73 |

In Embodiment 2, the energy level relationship between the BBBC material and the compound F-1 material may satisfy 2.55<2.52+0.1, to form a TADF exciplex. The luminescence peak of the exciplex may be red-shifted by less than 0.3 eV with respect to the peak of a minimum absorption band of the of Ir(ppy)3. The luminescence peak of the exciplex may be red-shifted by less than 0.3 eV with respect to the absorption peak of the BBCZ material. The luminescence peak of the Ir(ppy)3 material may be red-shifted by less than 0.3 eV with respect to the absorption peak in visible light band of the BBCZ material. The energy difference between the luminescence peak of the energy donor and the absorption peak of the energy acceptor may be substantially small, such that the energy transfer inside the light-emitting layer may be substantially efficient.

The singlet energy level of the exciplex>the singlet energy level of Ir(ppy)3>the singlet energy level of BBCZ, and the triplet energy level of the exciplex>the triplet energy level of Ir(ppy)3>the triplet energy level of BBCZ material. Through configuring the setting of the singlet energy levels and triplet energy levels of the materials, high-efficient light emission may be achieved. The difference between the HOMO energy level of the BBBC material and the HOMO energy level of the electron blocking layer may be less than 0.3 eV, and the difference between the LUMO energy level of the compound F-1 material and the energy level of the hole blocking layer may be less than 0.3 eV, which may transport holes and electrons respectively to balance carriers inside the light-emitting layer.

The energy level data of the P-type host material and the N-type host material in certain embodiments may meet the preset conditions in the present disclosure, and the exciplex-based TADF characteristic device may have desired performance.

Comparative Embodiment 14 may include a pure fluorescent material device with low efficiency. Comparative Embodiment 13 and comparative Embodiment 15 may include conventional super-fluorescent materials with poor efficiency and lifetime. The efficiency and lifetime of the light-emitting device prepared in the disclosed embodiments of the present disclosure may have been significantly improved. In the present disclosure, the synergistic action of the phosphorescent material, the multiple resonance fluorescent material, and the TADF material may improve the efficiency and lifetime of the device. The energy levels of the phosphorescent material, the multiple resonance fluorescent material and the TADF material may match each other to make the device have desired performance. The material with TADF characteristics based on exciplex may also improve the efficiency and lifetime of the device.

The disclosed embodiments may have following beneficial effects. In the present disclosure, the phosphorescent material added in the light-emitting layer may receive triplet excitons, and the triplet excitons may be transferred to the singlet energy level of the multiple resonance fluorescent material, thereby reducing the triplet excitons inside the device and improving the device life. The multiple resonance fluorescent material may convert the triplet excitons into singlet excitons while receiving a small quantity of triplet excitons, thereby improving the device efficiency. Due to the double quenching effect of the phosphorescent material and the multiple resonance fluorescent material on the TADF material, the luminescence of the TADF material may be fully suppressed, which may improve the stability of the emission spectrum.

In the present disclosure, the triplet excitons may be converted into singlet excitons through the synergistic action of the TADF material, the phosphorescent material and the multiple resonance fluorescent material, which may reduce the quantity of triplet excitons and may improve the device life and efficiency. The TADF material may transfer a portion of the triplet excitons and singlet excitons to the phosphorescent material. Due to the heavy metal spin-orbit coupling effect, the singlet energy level and the triplet energy level of the phosphorescent material may overlap each other, and the phosphorescent material may transfer energy in the form of singlet state to the multiple resonance fluorescent material. In addition, the TADF material may transfer a portion of the singlet excitons and a small quantity of triplet excitons to the multiple resonance fluorescent material. Because the multiple resonance fluorescent material has weak TADF characteristics, the received small quantity of triplet excitons may be converted into singlet excitons. The energy in the phosphorescent material and TADF material may be transferred to the multiple resonance fluorescent material without loss in theory, and the multiple resonance fluorescent material, as a high-efficiency light-emitting material, may fully convert the energy into light in time, such that the device may have highest efficiency. In the present disclosure, the triplet excitons may be converted into singlet excitons that are capable of emitting light rapidly through the synergistic action of the TADF material and the phosphorescent material, the quantity of excitons in the device may be reduced, and the device life may increase.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A light-emitting layer, comprising:

a thermally activated delayed fluorescence (TADF) material, a phosphorescent material, a multiple resonance fluorescent material and a host material, wherein:

a difference between HOMO energy levels of the host material and the TADF material is less than 0.1 eV, and a difference between LUMO energy levels of the host material and the TADF material is less than 0.1 eV;

a difference between HOMO energy levels of the TADF material and the phosphorescent material is less than 0.1 eV, and a difference between LUMO energy levels of the TADF material and the phosphorescent material is less than 0.1 eV; and a difference between HOMO energy levels of the phosphorescent material and the multiple resonance fluorescent material is less than 0.1 eV, and a difference between LUMO energy levels of the phosphorescent material and the multiple resonance fluorescent material is less than 0.1 eV.

2. The light-emitting layer according to claim 1, wherein:

a singlet energy level of the host material is greater than a singlet energy level of the TADF material, and a triplet energy level of the host material is greater than a triplet energy level of the TADF material;

the singlet energy level of the TADF material is greater than a singlet energy level of the phosphorescent material, and the triplet energy level of the TADF material is greater than a triplet energy level of the phosphorescent material; and the singlet energy level of the phosphorescent material is greater than a singlet energy level of the multiple resonance fluorescent material, and the triplet energy level of the phosphorescent material is greater than a triplet energy level of the multiple resonance fluorescent material; or highest-occupied molecular orbital (HOMO) energy levels of the host material, the TADF material, the phosphorescent material and the multiple resonance fluorescent material gradually increase; and lowest-unoccupied molecular orbital (LUMO) energy levels of the host material, the TADF material, the phosphorescent material and the multiple resonance fluorescent material gradually decrease.

3. The light-emitting layer according to claim 1, wherein:

a difference between a HOMO energy level of the TADF material and a LUMO energy level of the phosphorescent material is greater than a triplet energy level of the phosphorescent material by more than 0.2 eV; and a difference between a LUMO energy level of the TADF material and a HOMO energy level of the phosphorescent material is greater than a triplet energy level of the phosphorescent material by more than 0.2 eV.

4. The light-emitting layer according to claim 1, wherein:

a difference between a HOMO energy level of the TADF material and a LUMO energy level of the multiple resonance fluorescent material is greater than a singlet energy level of the multiple resonance fluorescent material by more than 0.2 eV; and a difference between a LUMO energy level of the TADF material and a HOMO energy level of the multiple resonance fluorescent material is greater than the singlet energy level of the multiple resonance fluorescent material by more than 0.2 eV.

5. The light-emitting layer according to claim 1, wherein:

a luminescence peak of the TADF material is red-shifted by less than 0.3 eV with respect to a peak of a minimum absorption band of the phosphorescent material;

a luminescence peak of the phosphorescent material is red-shifted by less than 0.3 eV with respect to an absorption peak in visible light band of the multiple resonance fluorescent material; and the luminescence peak of the TADF material is red-shifted by less than 0.3 eV with respect to the absorption peak in visible light band of the multiple resonance fluorescent material.

6. The light-emitting layer according to claim 1, wherein:

the TADF material has a structure of Formula A:

Formula A

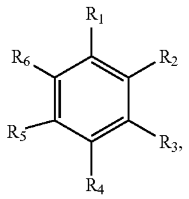

wherein in the Formula A, $R_1$-$R_6$ are independently selected from hydrogen, deuterium, halogen, cyano, alkyl, substituted or unsubstituted aryl, and substituted or unsubstituted heteroaryl; and the halogen in the Formula A is selected from F, the alkyl is selected from methyl and $CD_3$, the aryl is selected from phenyl, and the heteroaryl is selected from following formulas:

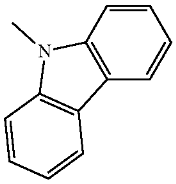

,

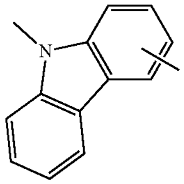

.

7. The light-emitting layer according to claim 6, wherein:

the TADF material is selected from one or more of structures of Formulas A-1 to A-20:

Formula A-1

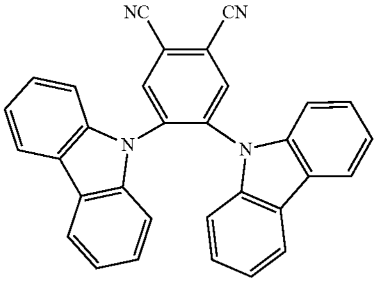

Formula A-2

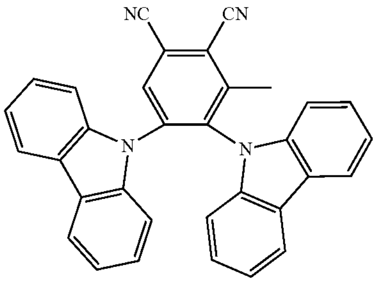

Formula A-3

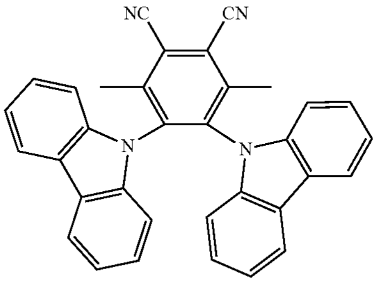

-continued

Formula A-4

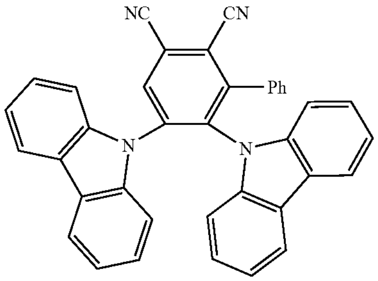

Formula A-5

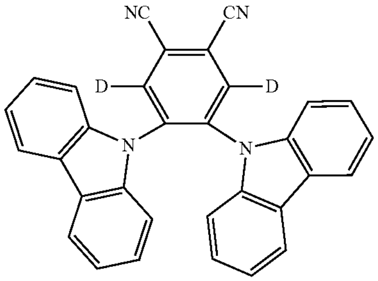

Formula A-6

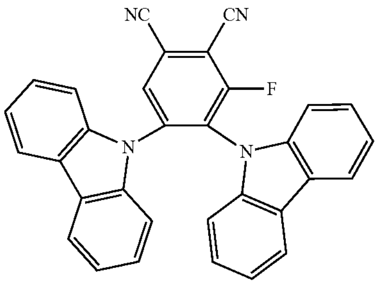

Formula A-7

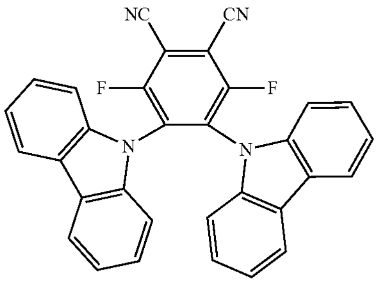

Formula A-8

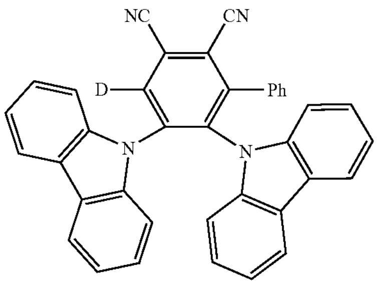

-continued
Formula A-9
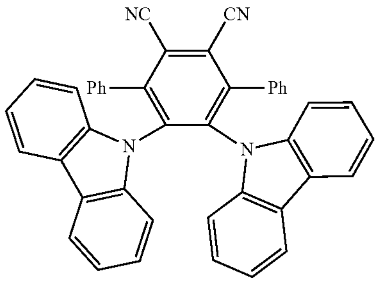
Formula A-10
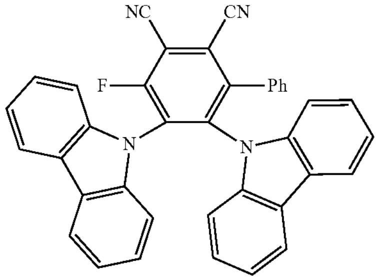
Formula A-11
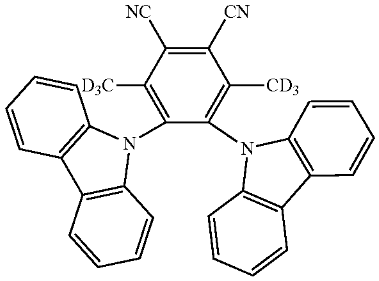
Formula A-12
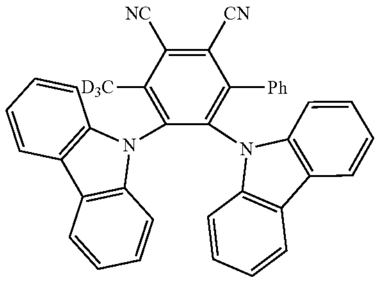
Formula A-13
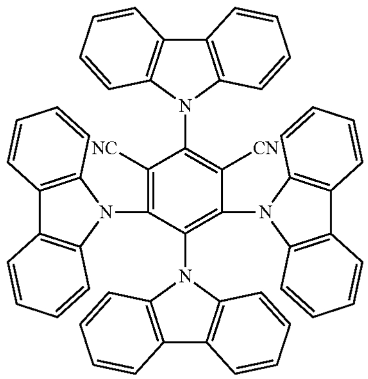
-continued
Formula A-14
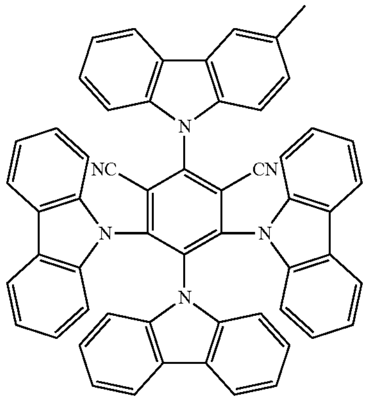
Formula A-15
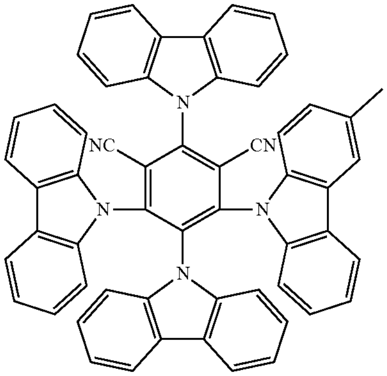
Formula A-16
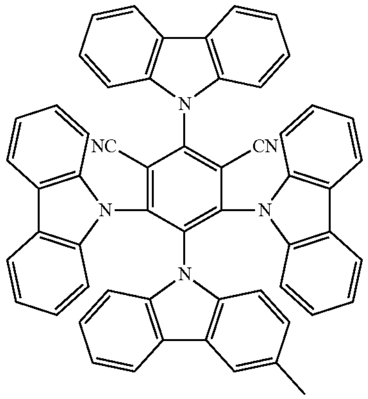
Formula A-17
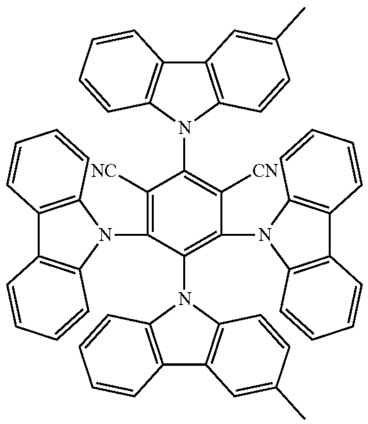

-continued

Formula A-18

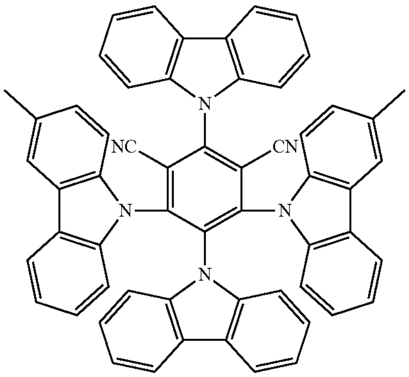

Formula A-19

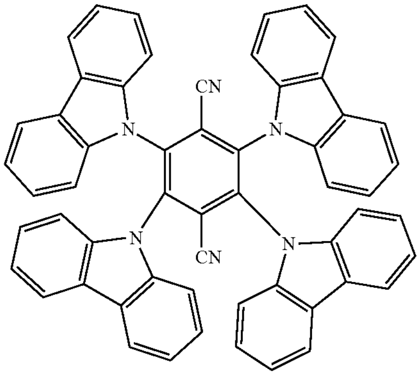

Formula A-20

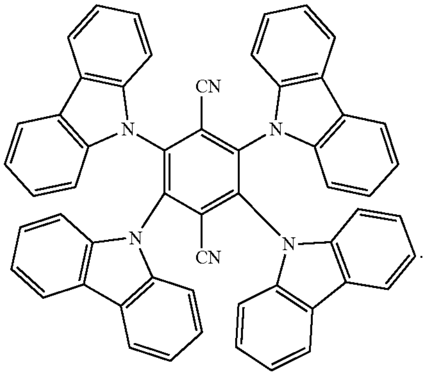

8. The light-emitting layer according to claim 1, wherein: the phosphorescent material has a structure of Formula B:

Formula B

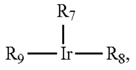

wherein in the Formula B, $R_7$-$R_9$ are independently selected from substituted or unsubstituted aryl, and substituted or unsubstituted heteroaryl; and the $R_7$-$R_9$ are independently selected from following groups:

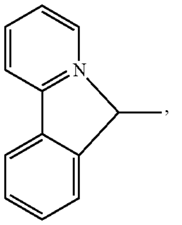

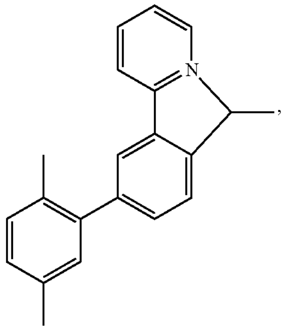

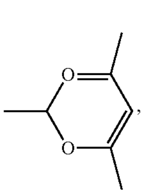

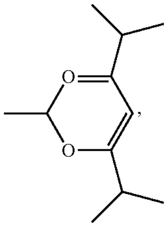

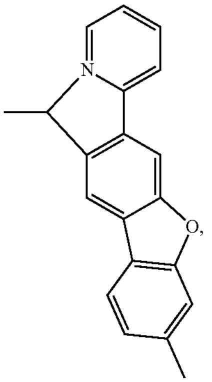

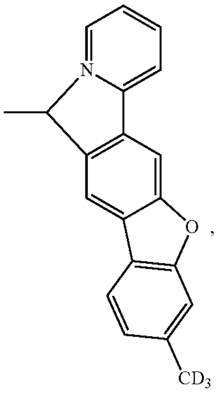

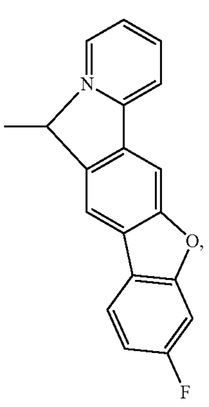

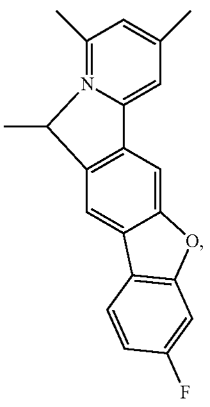

-continued
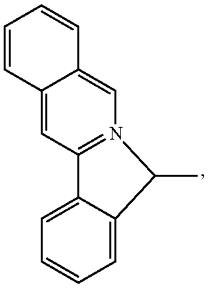
,
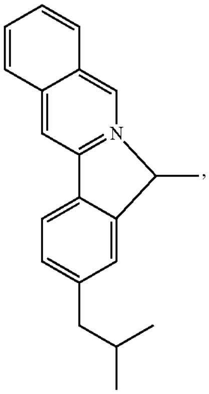
,
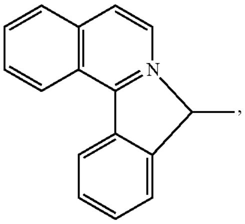
,
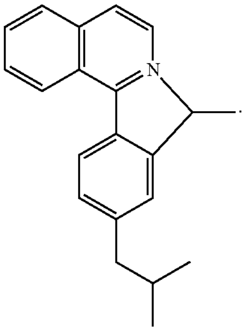
.
9. The light-emitting layer according to claim 8, wherein: the phosphorescent material is selected from one or more of structures of Formulas B-1 to B-14:
Formula B-1
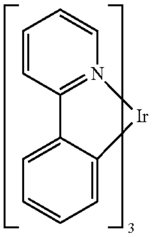
Formula B-2
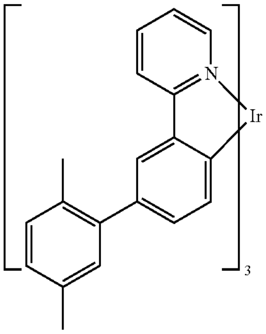
-continued
Formula B-3
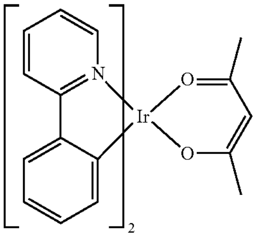
Formula B-4
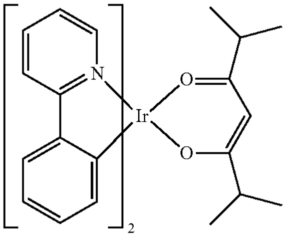
Formula B-5
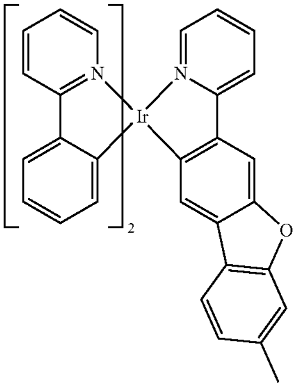
Formula B-6
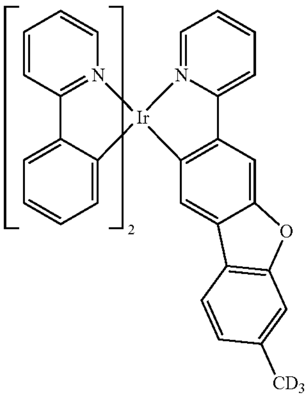

-continued
Formula B-7
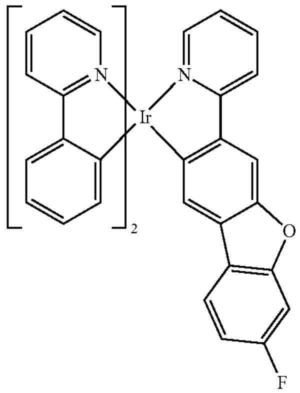
Formula B-8
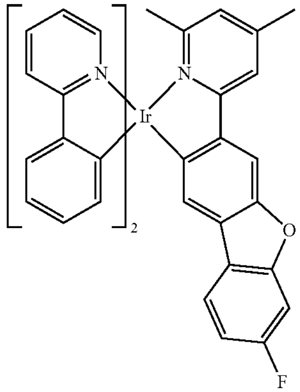
Formula B-9
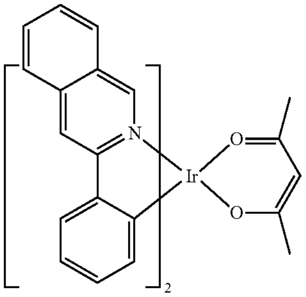
Formula B-10
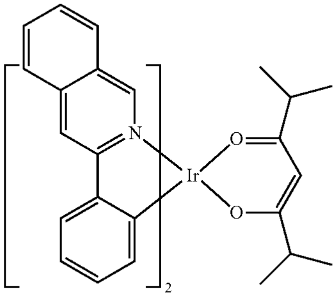
-continued
Formula B-11
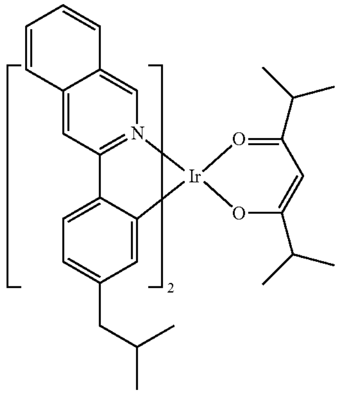
Formula B-12
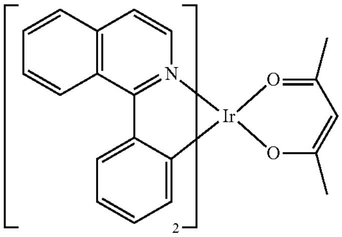
Formula B-13
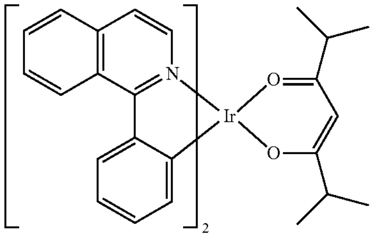
Formula B-14
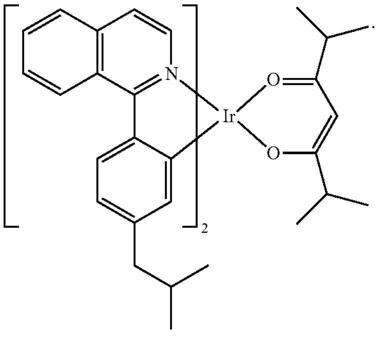

10. The light-emitting layer according to claim 1, wherein:

the multiple resonance fluorescent material has a structure of Formula C:

Formula C

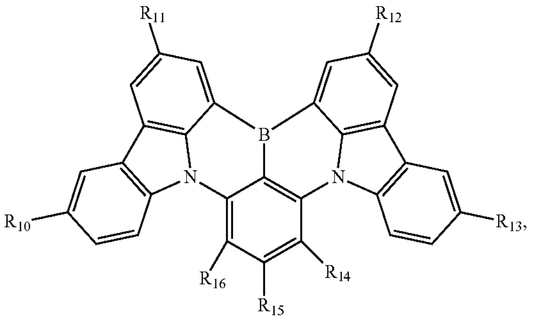

wherein in the Formula C, $R_{10}$-$R_{16}$ are independently selected from hydrogen, deuterium, halogen, —B═, substituted or unsubstituted alkyl, substituted or unsubstituted aryl, and substituted or unsubstituted heteroaryl; and unsubstituted alkyl group in the Formula C is selected from methyl and butyl, substituted alkyl group is selected from —$Si(CH_3)_3$, aryl group is selected from phenyl, and heteroaryl is selected from following structures:

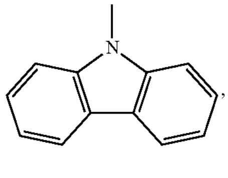
,
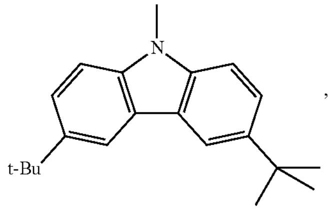
,
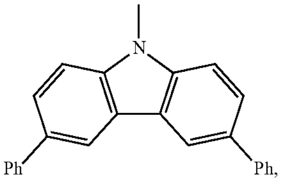
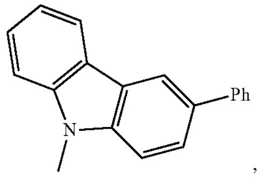
,
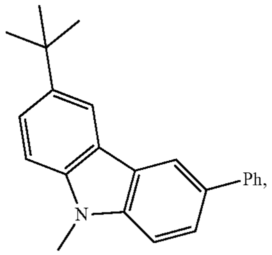
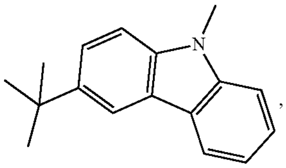
,

-continued

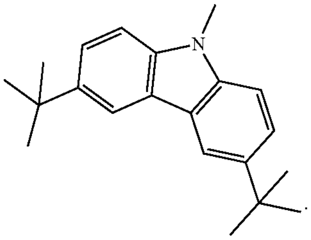

11. The light-emitting layer according to claim 10, wherein:

the multiple resonance fluorescent material is selected from one of structures of Formula C-1 to Formula C-19:

Formula C-1

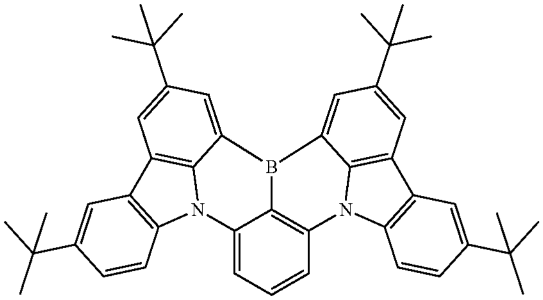

Formula C-2

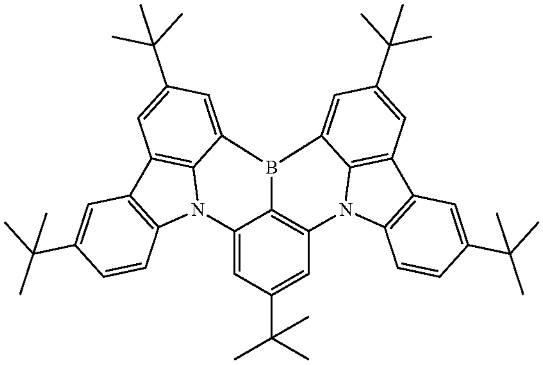

Formula C-3

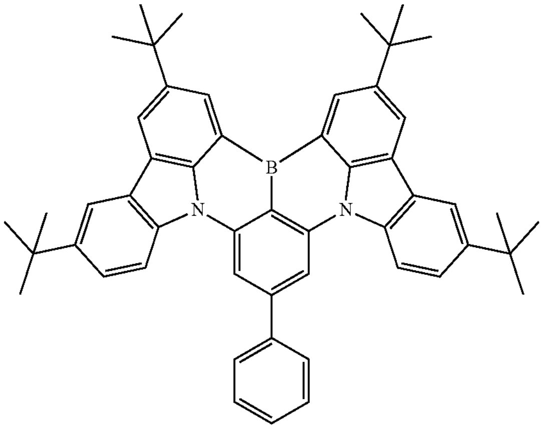

-continued
Formula C-4
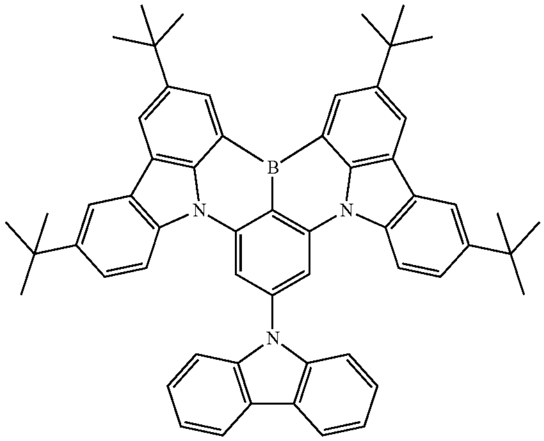
Formula C-5
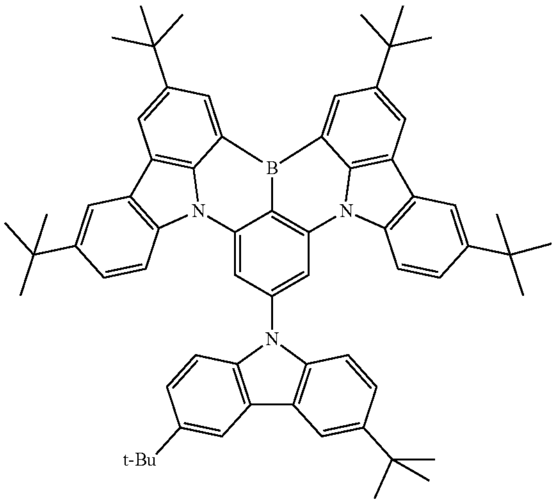
Formula C-6
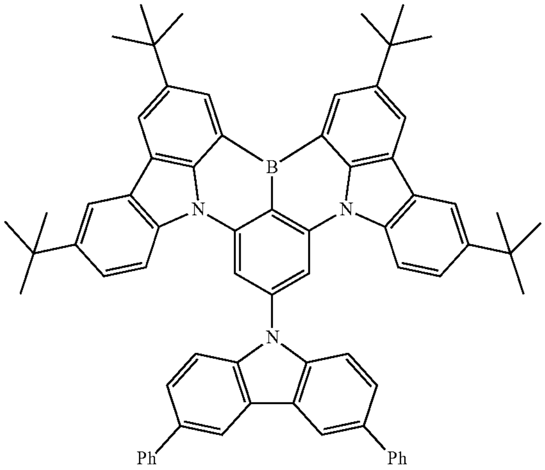
-continued
Formula C-7
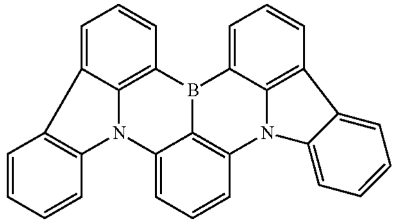
Formula C-8
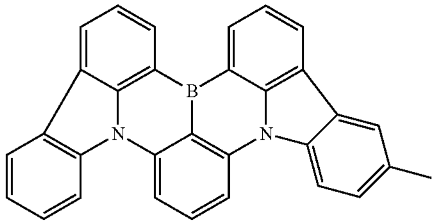
Formula C-9
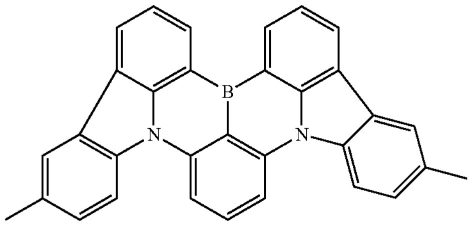
Formula C-10
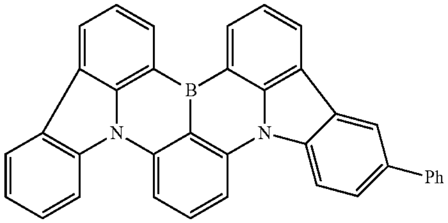
Formula C-11
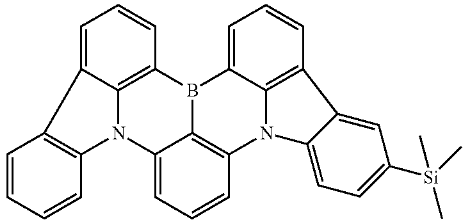
Formula C-12
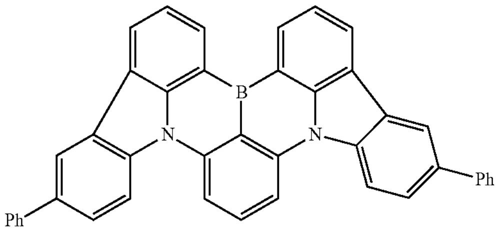

-continued
Formula C-13
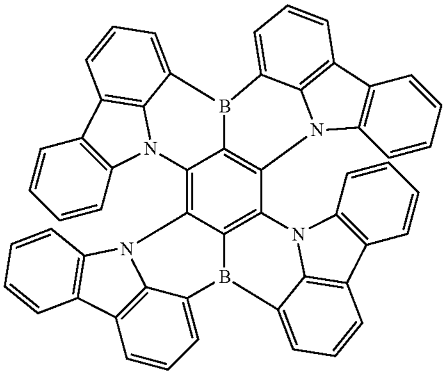
Formula C-14
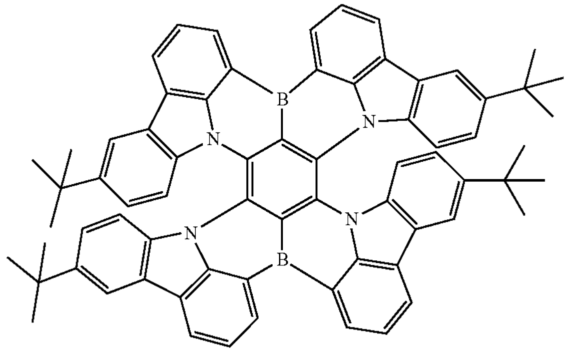
Formula C-15
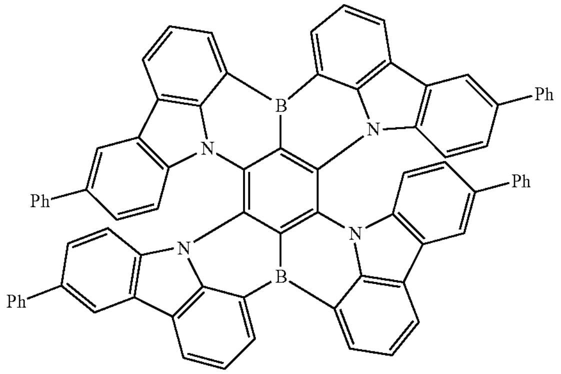
-continued
Formula C-16
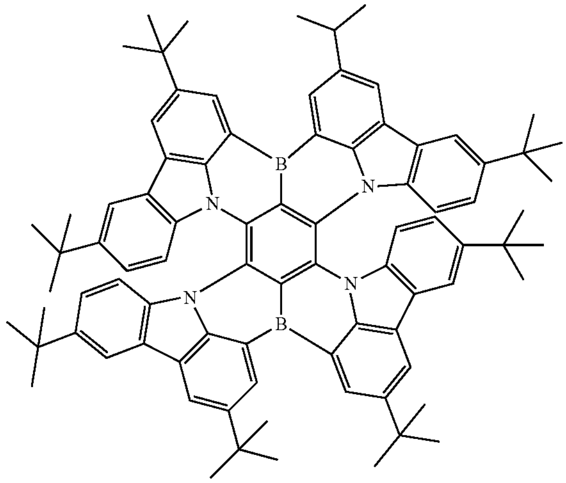
Formula C-17
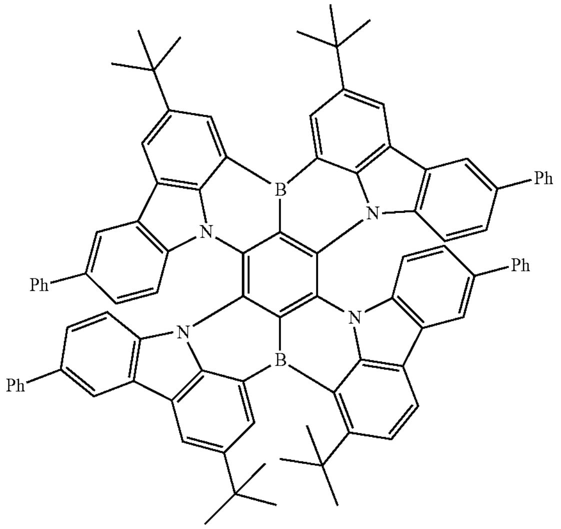
Formula C-18
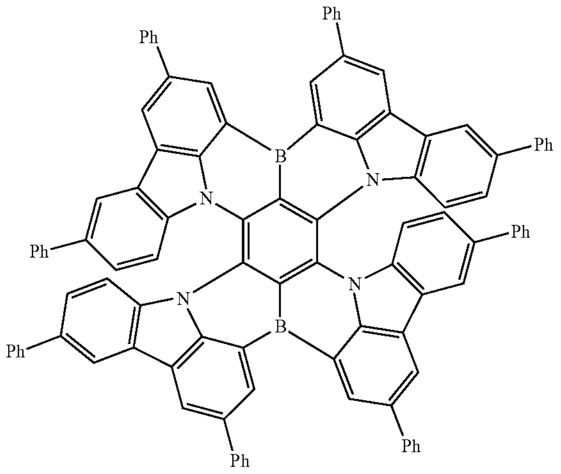

-continued

Formula C-19

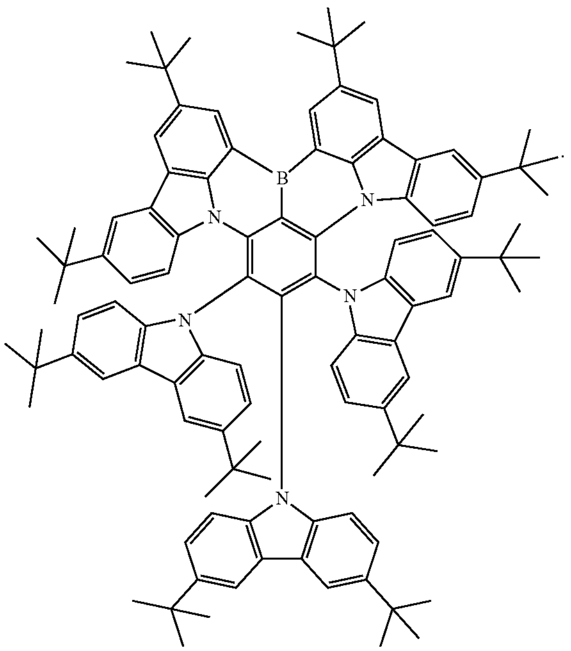

12. The light-emitting layer according to claim 1, wherein:

the host material has a structure of Formula D:

Formula D

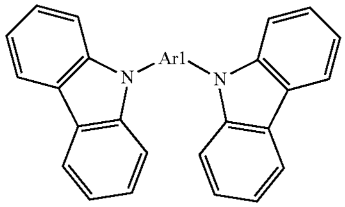

, wherein in the Formula D, Ar1 is selected from substituted or unsubstituted aryl, and substituted or unsubstituted heteroaryl; and the Ar1 is selected from following structures:

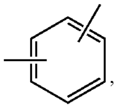,
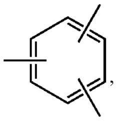,
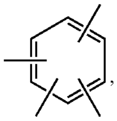,
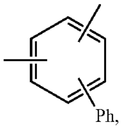,
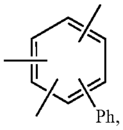,
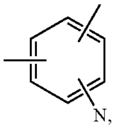,
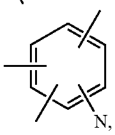,
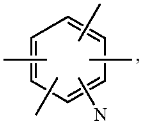,
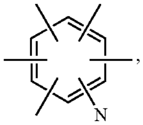,
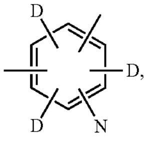, -continued

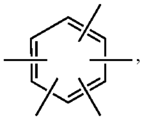,
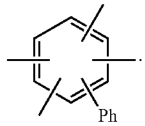.

13. The light-emitting layer according to claim 12, wherein:

the host material is selected from one or more structures of Formula D-1 to Formula D-36:

Formula D-1

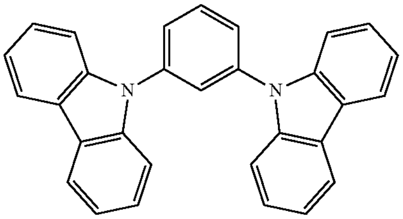

Formula D-2

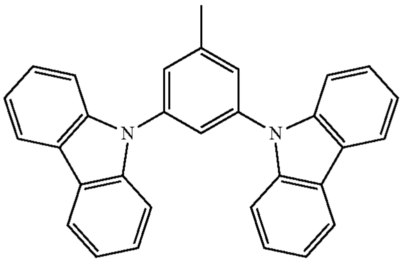

Formula D-3

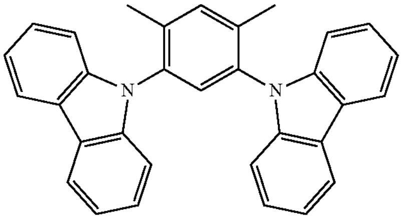

Formula D-4

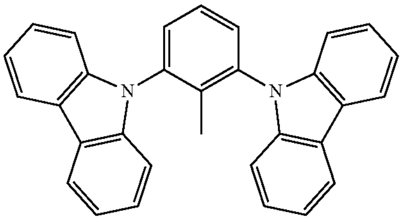

Formula D-5

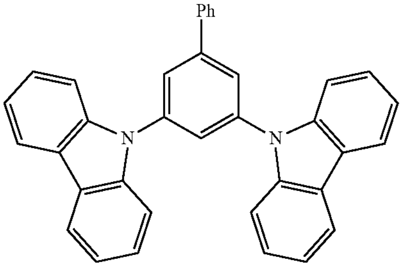

-continued
Formula D-6
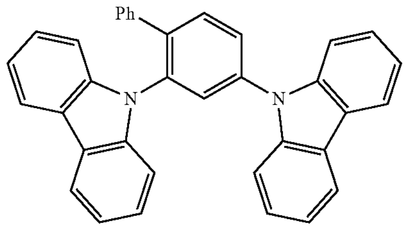
Formula D-7
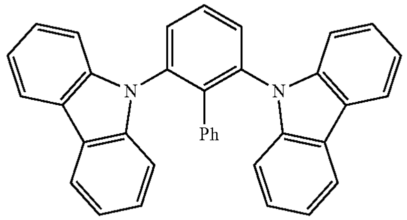
Formula D-8
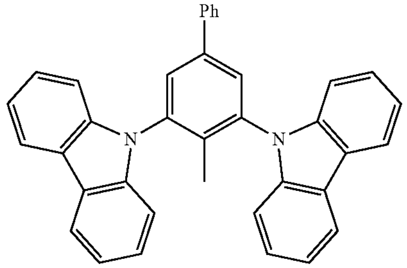
Formula D-9
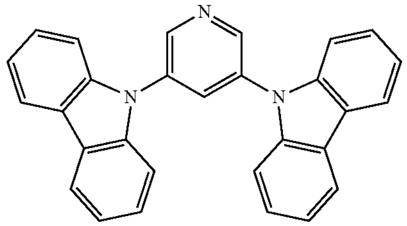
Formula D-10
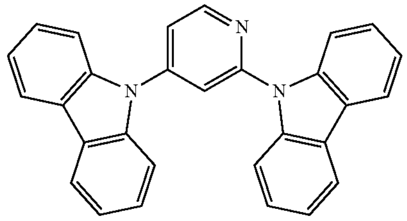
Formula D-11
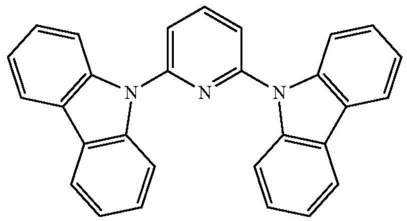
-continued
Formula D-12
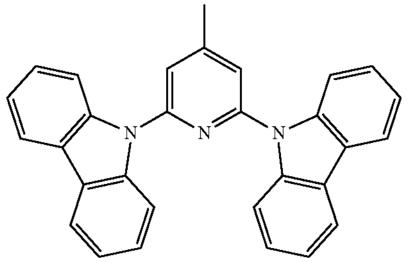
Formula D-13
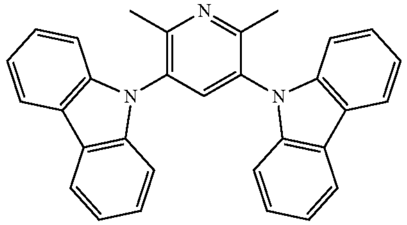
Formula D-14
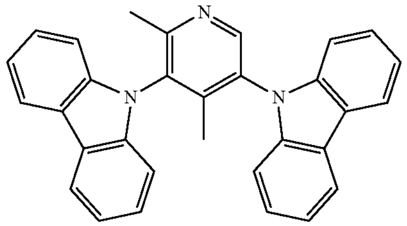
Formula D-15
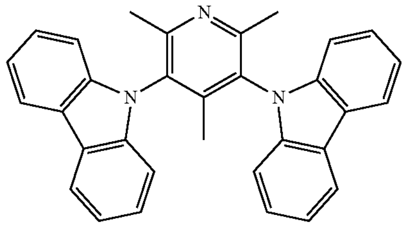
Formula D-16
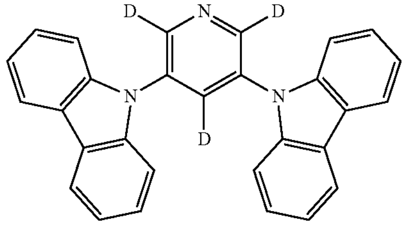
Formula D-17
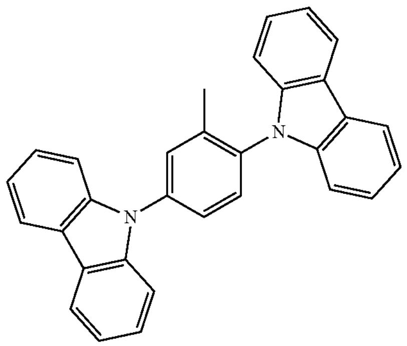

-continued
Formula D-18
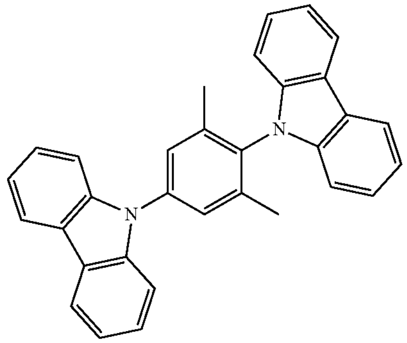
Formula D-19
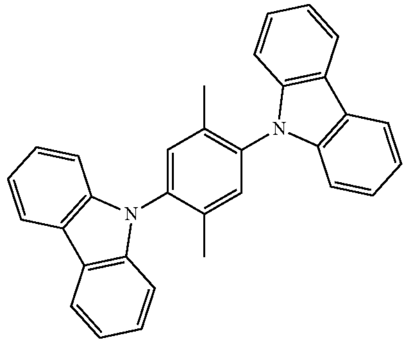
Formula D-20
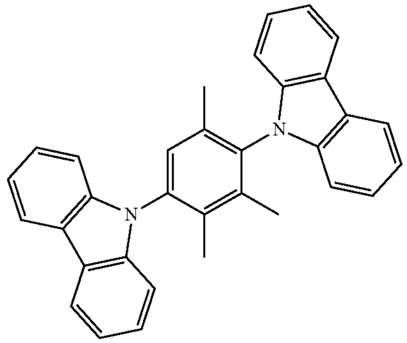
Formula D-21
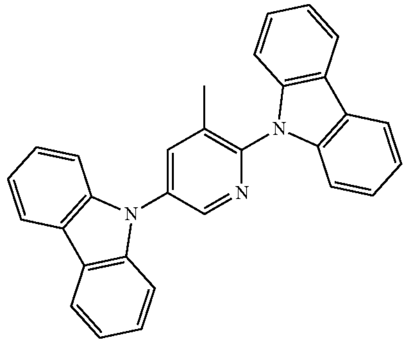
-continued
Formula D-22
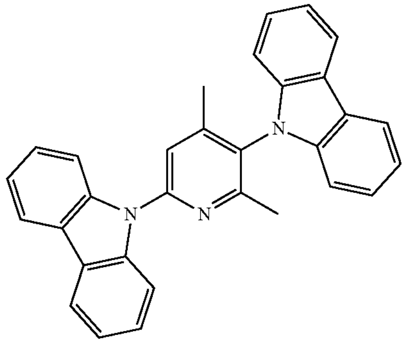
Formula D-23
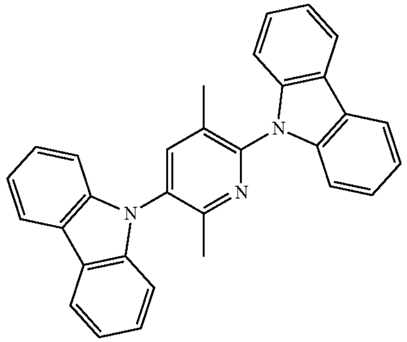
Formula D-24
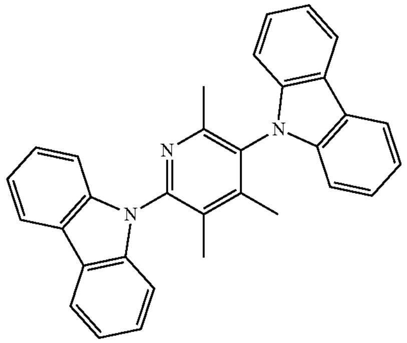
Formula D-25
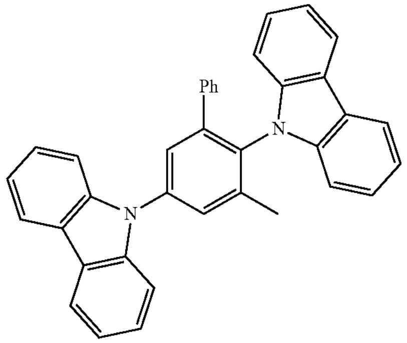

-continued
Formula D-26
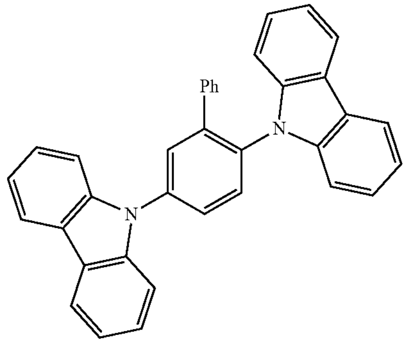
Formula D-27
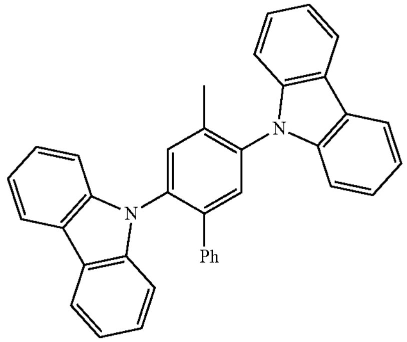
Formula D-28
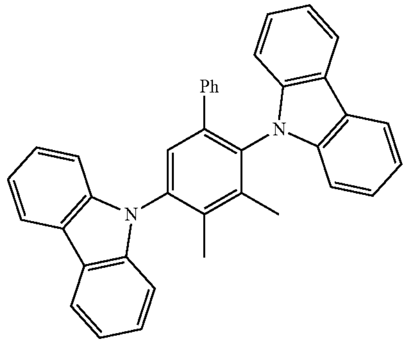
Formula D-29
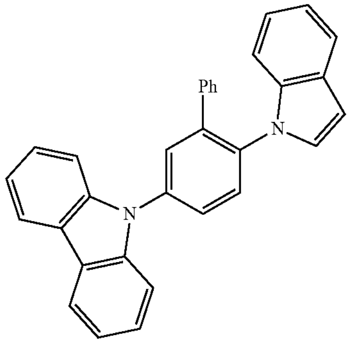
-continued
Formula D-30
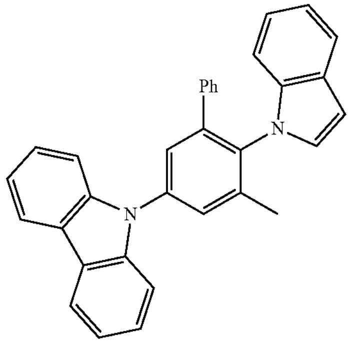
Formula D-31
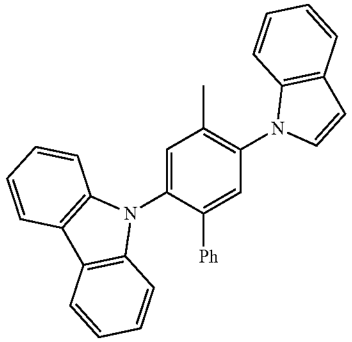
Formula D-32
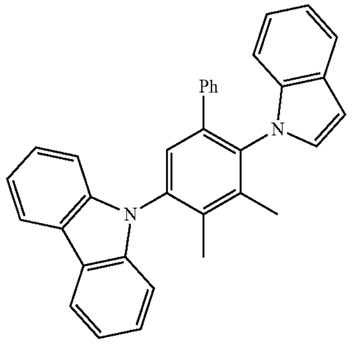
Formula D-33
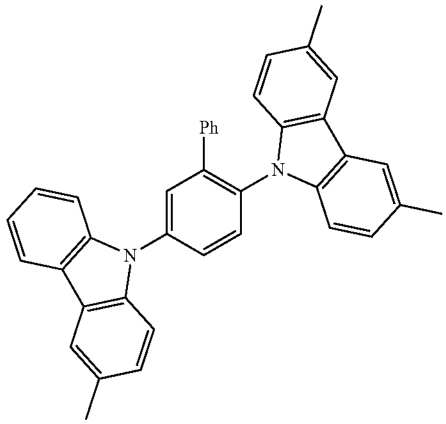

-continued

Formula D-34

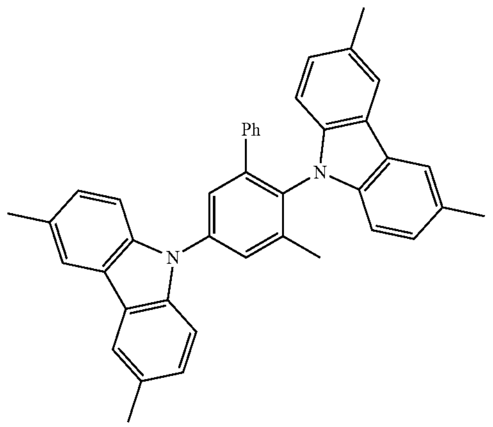

Formula D-35

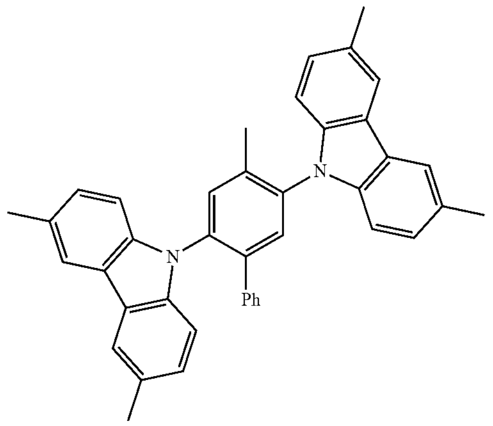

Formula D-36

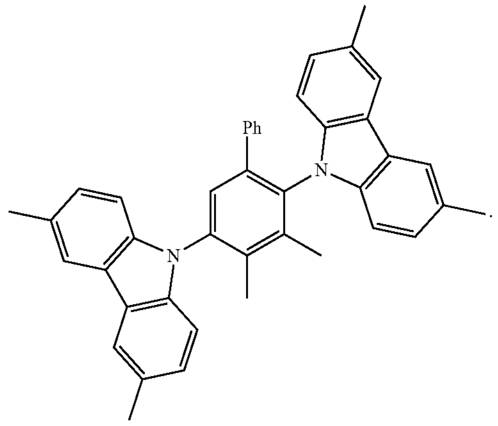

14. The light-emitting layer according to claim 1, wherein:

the TADF material and the host material is replaced by an exciplex with TADF characteristic made of a P-type host material and an N-type host material, wherein:

the P-type host material is denoted as H1, and the N-type host material is denoted as H2, and LUMO, HOMO, and T1 energy levels of the P-type host material and the N-type host material satisfy following relationship: Min{LUMO(H1)−HOMO(H2), LUMO($H_2$)−HOMO(H1)}≤Min{T1(H1), T1(H2)}+0.1 eV.

15. The light-emitting layer according to claim 14, wherein:

the P-type host material has a structure of Formula E,

Formula E

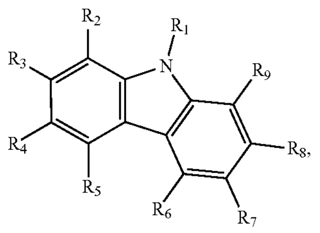

wherein in the Formula E, $R_1$-$R_9$ are independently selected from substituted or unsubstituted C1-C18 alkyl, substituted or unsubstituted C6-C60 aryl group, substituted or unsubstituted C5-C60 heteroaryl, substituted or unsubstituted deuterated C1-C18 alkyl, substituted or unsubstituted deuterated C6-C60 aryl, and substituted or unsubstituted deuterated C5-C60 heteroaryl;

the N-type host material has a structure of Formula F1 or Formula F2:

Formula F1

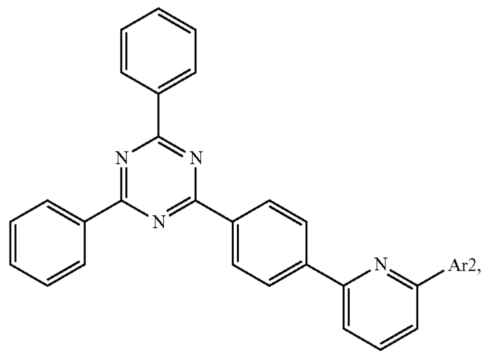

wherein in the Formula F1, Ar2 is selected from naphthyl or N-substituted naphthyl, and Formula F2

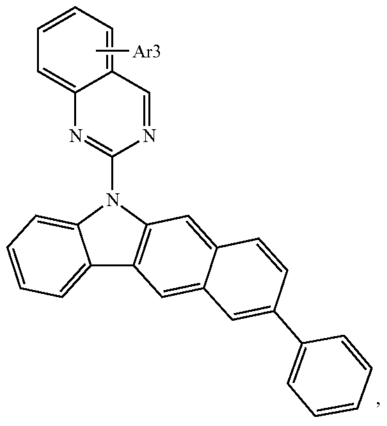

wherein in the Formula F2, Ar3 is selected from phenyl or N-substituted phenyl; and the substituted groups in $R_1$-$R_9$ of the Formula E are independently selected from fluorine, methyl, ethyl, tert-butyl, phenyl, naphthyl, phenanthryl, pyrenyl, pyridyl, quinolinyl, isoquinolinyl, phenanthridine, phenanthroline, carbazolyl, indolyl, thienyl, imidazolyl, thiazolyl or pyrrolyl.

16. The light-emitting layer according to claim 15, wherein:

the P-type host material is selected from one or more of structures of Formulas E-1 to E-9:

Formula E-1

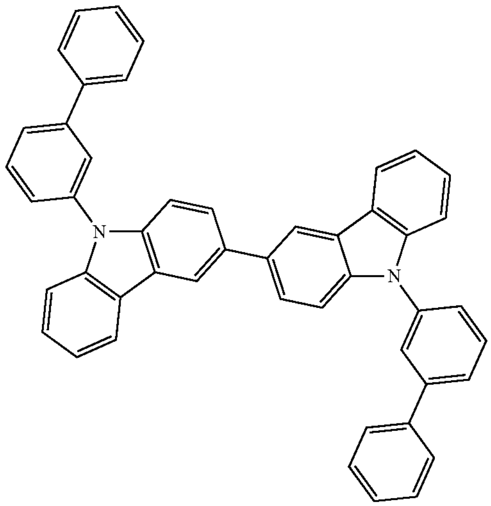

Formula E-2

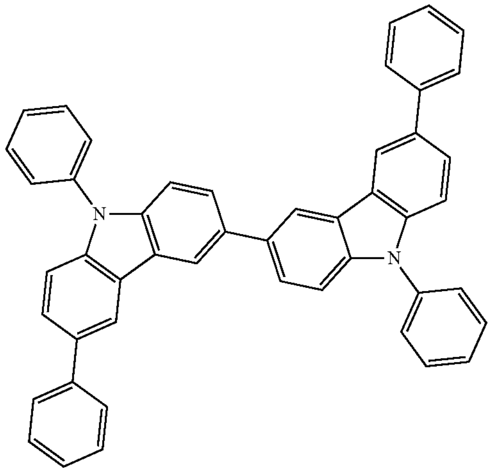

Formula E-3

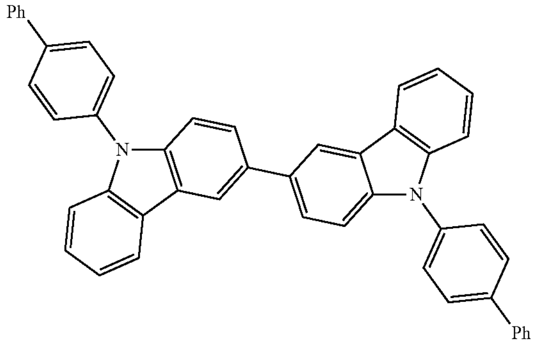

-continued

Formula E-4

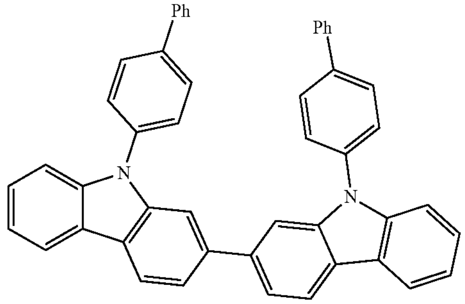

Formula E-5

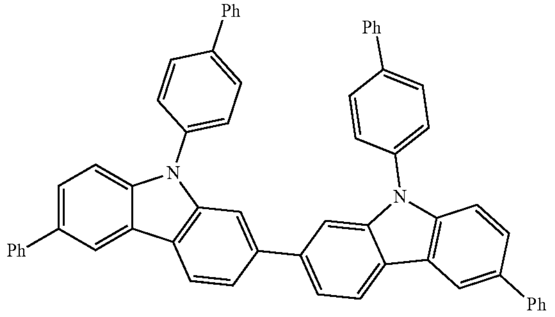

Formula E-6

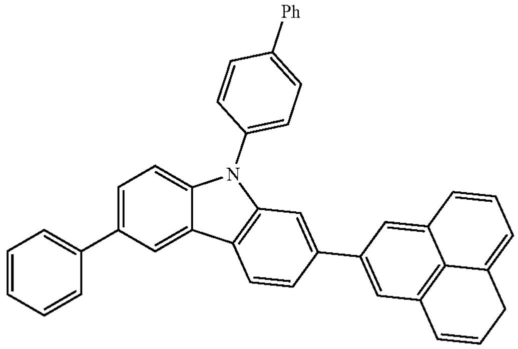

Formula E-7

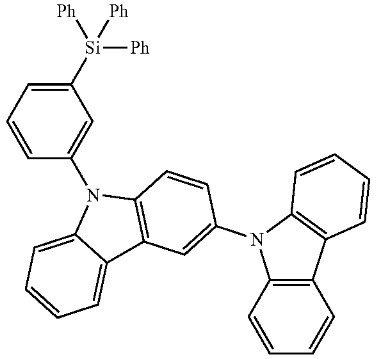

-continued
Formula E-8
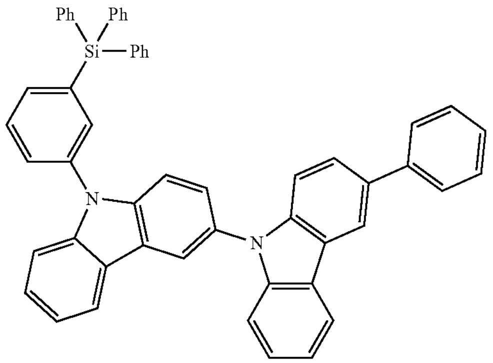
Formula E-9
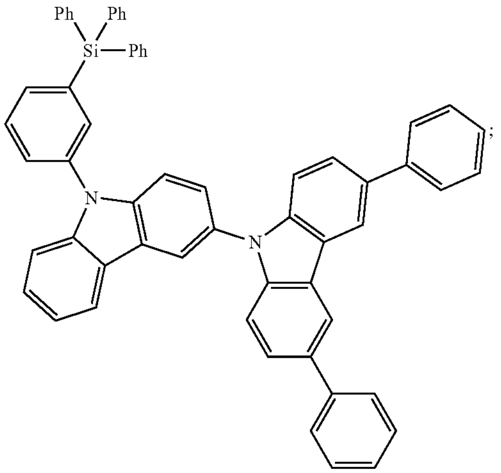
and/or
the N-type host material is selected from one or more structures of Formulas F-1 to F12:
Formula F-1
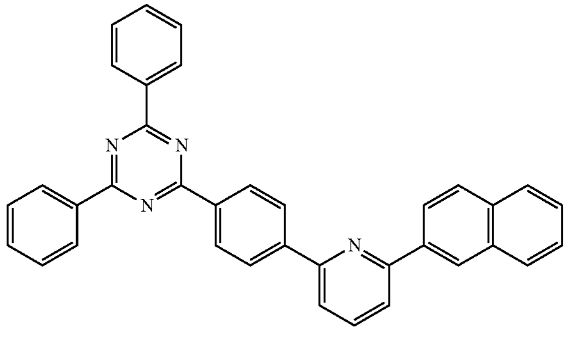
-continued
Formula F-2
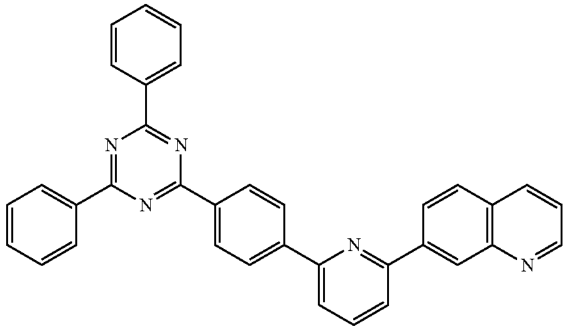
Formula F-3
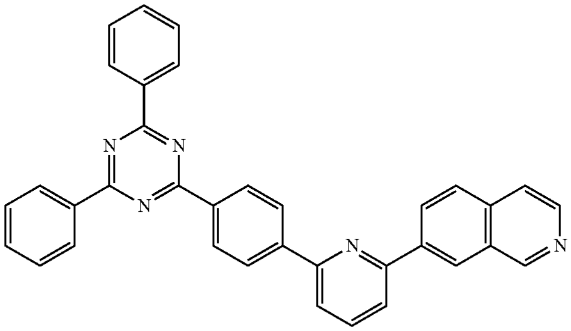
Formula F-4
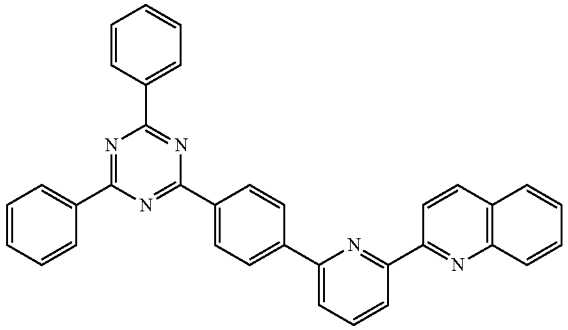
Formula F-5
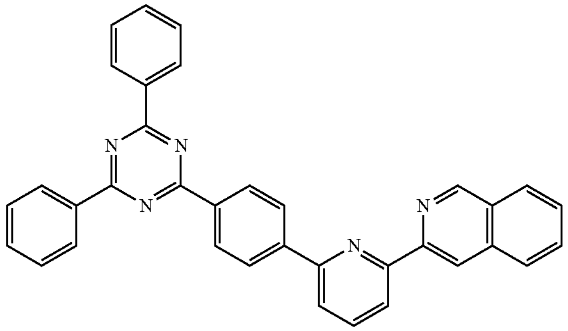

-continued
Formula F-6
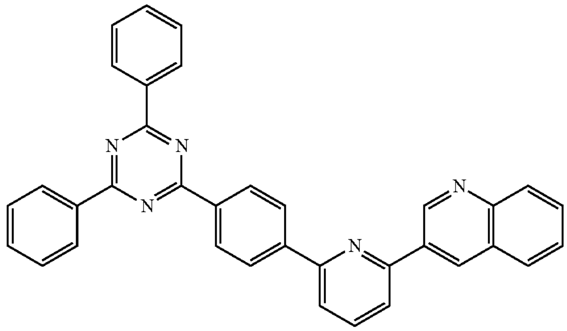
Formula F-7
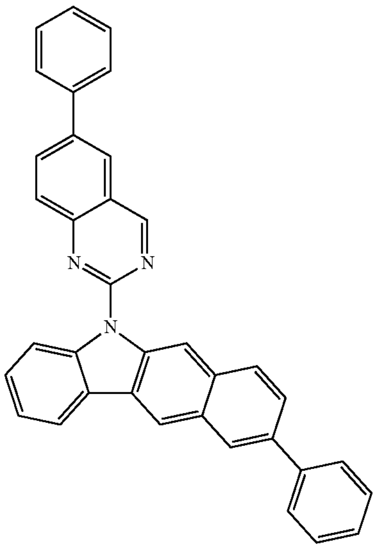
Formula F-8
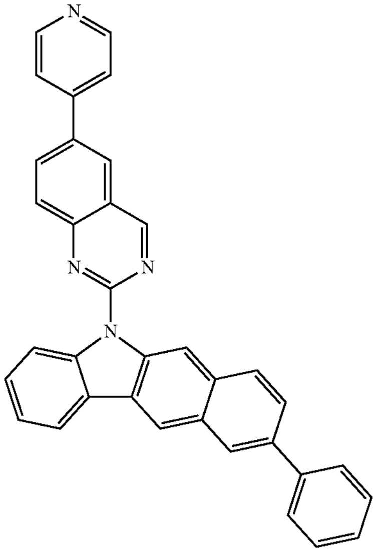
-continued
Formula F-9
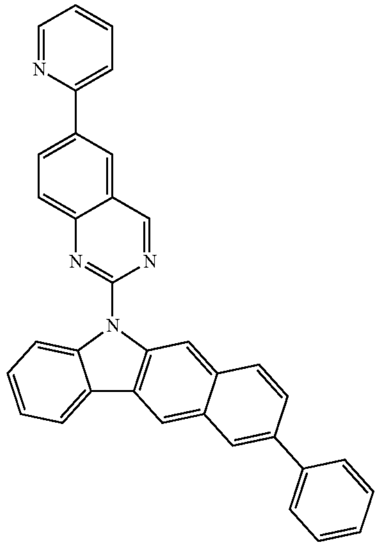
Formula F-10
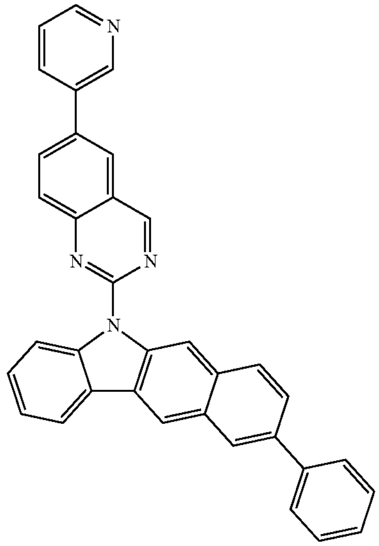
Formula F-11
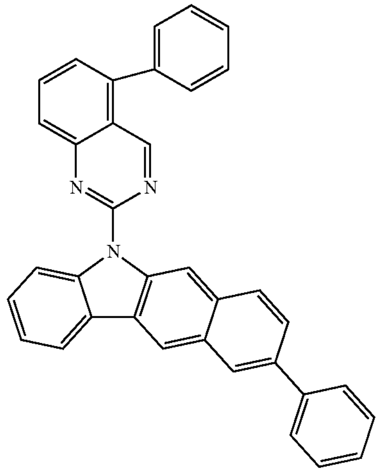

-continued

Formula F-12

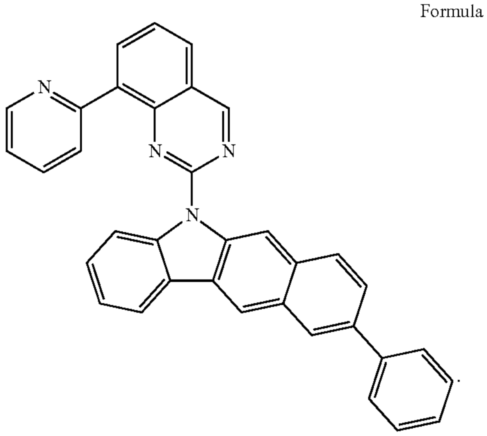

17. The light-emitting layer according to claim 1, wherein:

a mass content of the TADF material in the light-emitting layer is in a range of approximately 10%-60%;

a mass content of the phosphorescent material in the light-emitting layer is in a range of approximately 1%-10%;

a mass content of the multiple resonance fluorescent material in the light-emitting layer is in a range of approximately 0.2%-2%; and a mass content of the host material in the light-emitting layer is in a range of approximately 10%-80%.

18. A light-emitting device, comprising:

a light-emitting layer, wherein the light-emitting layer includes a TADF material, a phosphorescent material, a multiple resonance fluorescent material and a host material, wherein:

a difference between HOMO energy levels of the host material and the TADF material is less than 0.1 eV, and a difference between LUMO energy levels of the host material and the TADF material is less than 0.1 eV;

a difference between HOMO energy levels of the TADF material and the phosphorescent material is less than 0.1 eV, and a difference between LUMO energy levels of the TADF material and the phosphorescent material is less than 0.1 eV; and a difference between HOMO energy levels of the phosphorescent material and the multiple resonance fluorescent material is less than 0.1 eV, and a difference between LUMO energy levels of the phosphorescent material and the multiple resonance fluorescent material is less than 0.1 eV.

19. A light-emitting apparatus, comprising:

a light-emitting device, wherein the light emitting device includes a light-emitting layer, the light-emitting layer including a TADF material, a phosphorescent material, a multiple resonance fluorescent material and a host material, wherein:

a difference between HOMO energy levels of the host material and the TADF material is less than 0.1 eV, and a difference between LUMO energy levels of the host material and the TADF material is less than 0.1 eV;

a difference between HOMO energy levels of the TADF material and the phosphorescent material is less than 0.1 eV, and a difference between LUMO energy levels of the TADF material and the phosphorescent material is less than 0.1 eV; and a difference between HOMO energy levels of the phosphorescent material and the multiple resonance fluorescent material is less than 0.1 eV, and a difference between LUMO energy levels of the phosphorescent material and the multiple resonance fluorescent material is less than 0.1 eV.

* * * * *